(12) United States Patent
Hu et al.

(10) Patent No.: US 11,005,074 B2
(45) Date of Patent: May 11, 2021

(54) DISPLAY DEVICE

(71) Applicant: InnoLux Corporation, Miao-Li County (TW)

(72) Inventors: Shun-Yuan Hu, Miao-Li County (TW); Tsau-Hua Hsieh, Miao-Li County (TW); Tzu-Min Yan, Miao-Li County (TW); Ming-Chang Lin, Miao-Li County (TW); Yu-Hsin Liu, Miao-Li County (TW); Shu-Ming Kuo, Miao-Li County (TW); Ming-I Chao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/865,673

(22) Filed: May 4, 2020

(65) Prior Publication Data

US 2020/0266388 A1 Aug. 20, 2020

Related U.S. Application Data

(62) Division of application No. 15/916,643, filed on Mar. 9, 2018, now Pat. No. 10,686,158.

(Continued)

(30) Foreign Application Priority Data

Sep. 11, 2017 (CN) .......................... 201710813708.2

(51) Int. Cl.
*H01L 33/50* (2010.01)
*H01L 33/64* (2010.01)
(Continued)

(52) U.S. Cl.
CPC ...... *H01L 51/5268* (2013.01); *H01L 25/0753* (2013.01); *H01L 33/62* (2013.01);
(Continued)

(58) Field of Classification Search
CPC ..... H01L 2224/0345; H01L 2224/0401; H01L 2224/04026; H01L 2224/05082;
(Continued)

(56) References Cited

U.S. PATENT DOCUMENTS

2002/0012096 A1* 1/2002 Uchiyama ........... G02F 1/13452
349/187
2007/0040192 A1* 2/2007 Shibayama ....... H01L 27/14683
257/233

(Continued)

*Primary Examiner* — Brian Turner
(74) *Attorney, Agent, or Firm* — McClure, Qualey & Rodack, LLP

(57) ABSTRACT

A display device is provided. The display device includes a light-emitting unit. The light-emitting unit includes a light-emitting part, wherein a light extraction structure is disposed on a first surface of the light-emitting part. The light-emitting unit also includes a connective part disposed on a second surface opposite to the first surface of the light-emitting part. The light-emitting unit further includes a protective part surrounding the light-emitting part and the connective part. In addition, the display device includes a substrate having a plurality of active elements and at least one bonding pad, wherein the bonding pad is electrically connected to the corresponding connective part of the light-emitting unit. The roughness of the light extraction structure is greater than or equal to 0.2 μm and less than or equal to 5 μm.

2 Claims, 25 Drawing Sheets

Related U.S. Application Data

(60) Provisional application No. 62/500,539, filed on May 3, 2017, provisional application No. 62/479,326, filed on Mar. 31, 2017.

(51) Int. Cl.

| | | |
|---|---|---|
| *H01L 33/46* | (2010.01) | |
| *H01L 33/58* | (2010.01) | |
| *H01L 51/52* | (2006.01) | |
| *H01L 25/075* | (2006.01) | |
| *H01L 33/62* | (2010.01) | |
| *H05B 45/00* | (2020.01) | |
| *H01L 25/16* | (2006.01) | |
| *H01L 33/44* | (2010.01) | |
| *H01L 33/54* | (2010.01) | |
| *H01L 33/20* | (2010.01) | |

(52) U.S. Cl.
CPC ......... *H01L 51/5275* (2013.01); *H05B 45/00* (2020.01); *H01L 25/167* (2013.01); *H01L 33/20* (2013.01); *H01L 33/44* (2013.01); *H01L 33/54* (2013.01); *H01L 2933/0091* (2013.01)

(58) Field of Classification Search
CPC . H01L 2224/05124; H01L 2224/05155; H01L 2224/05166; H01L 2224/0511; H01L 2224/05639; H01L 2224/05644; H01L 2224/05669

See application file for complete search history.

(56) References Cited

U.S. PATENT DOCUMENTS

| | | | |
|---|---|---|---|
| 2009/0093075 A1* | 4/2009 | Chu | H01L 33/0093 438/33 |
| 2010/0176410 A1* | 7/2010 | Furuyama | H01L 33/46 257/98 |
| 2011/0266569 A1* | 11/2011 | Basin | H01L 33/0095 257/98 |
| 2015/0050760 A1* | 2/2015 | Imazu | H01L 33/486 438/27 |
| 2015/0295154 A1* | 10/2015 | Tu | H01L 33/22 438/27 |
| 2016/0343911 A1* | 11/2016 | Chae | H01L 33/32 |
| 2017/0140948 A1* | 5/2017 | Kimura | H01L 21/561 |

* cited by examiner

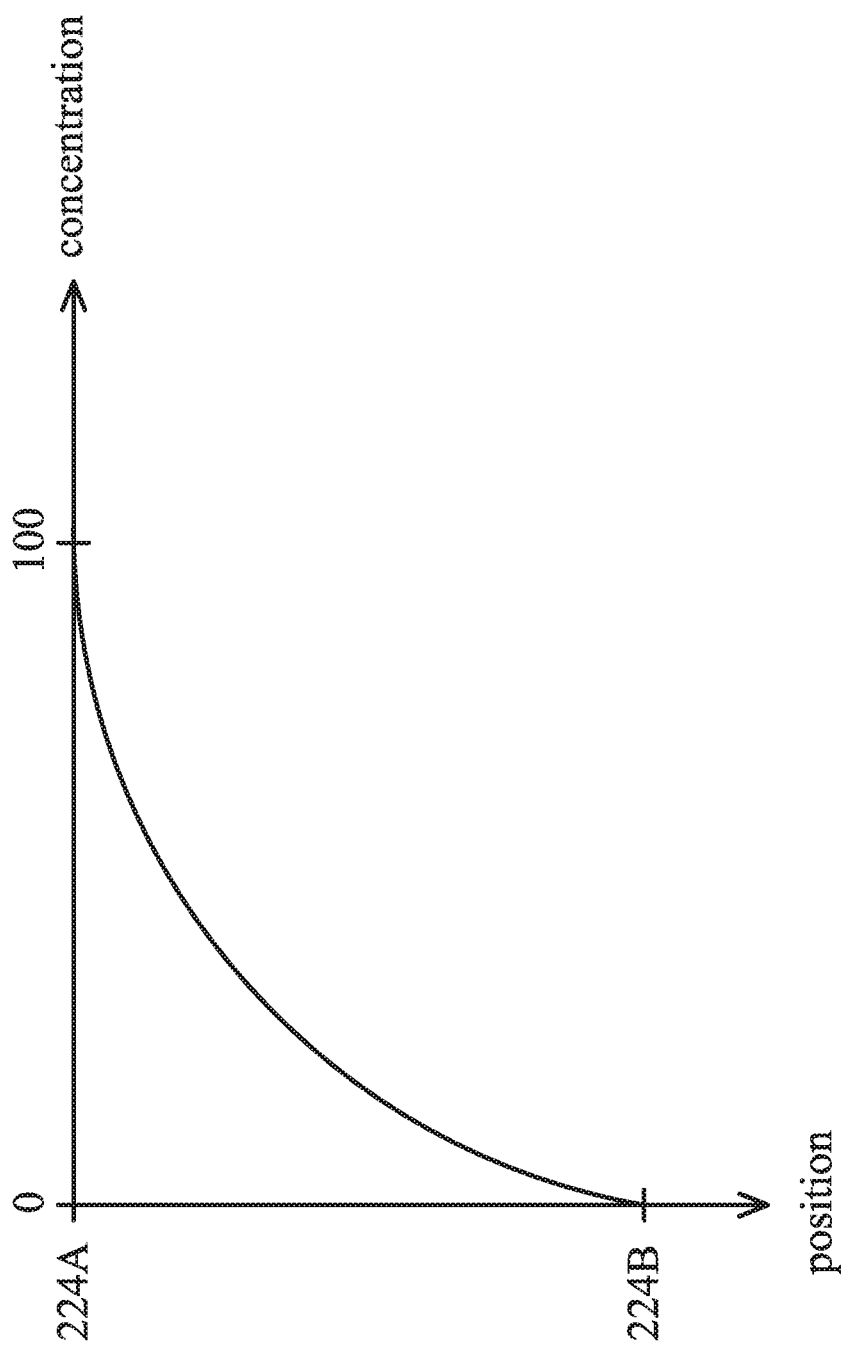

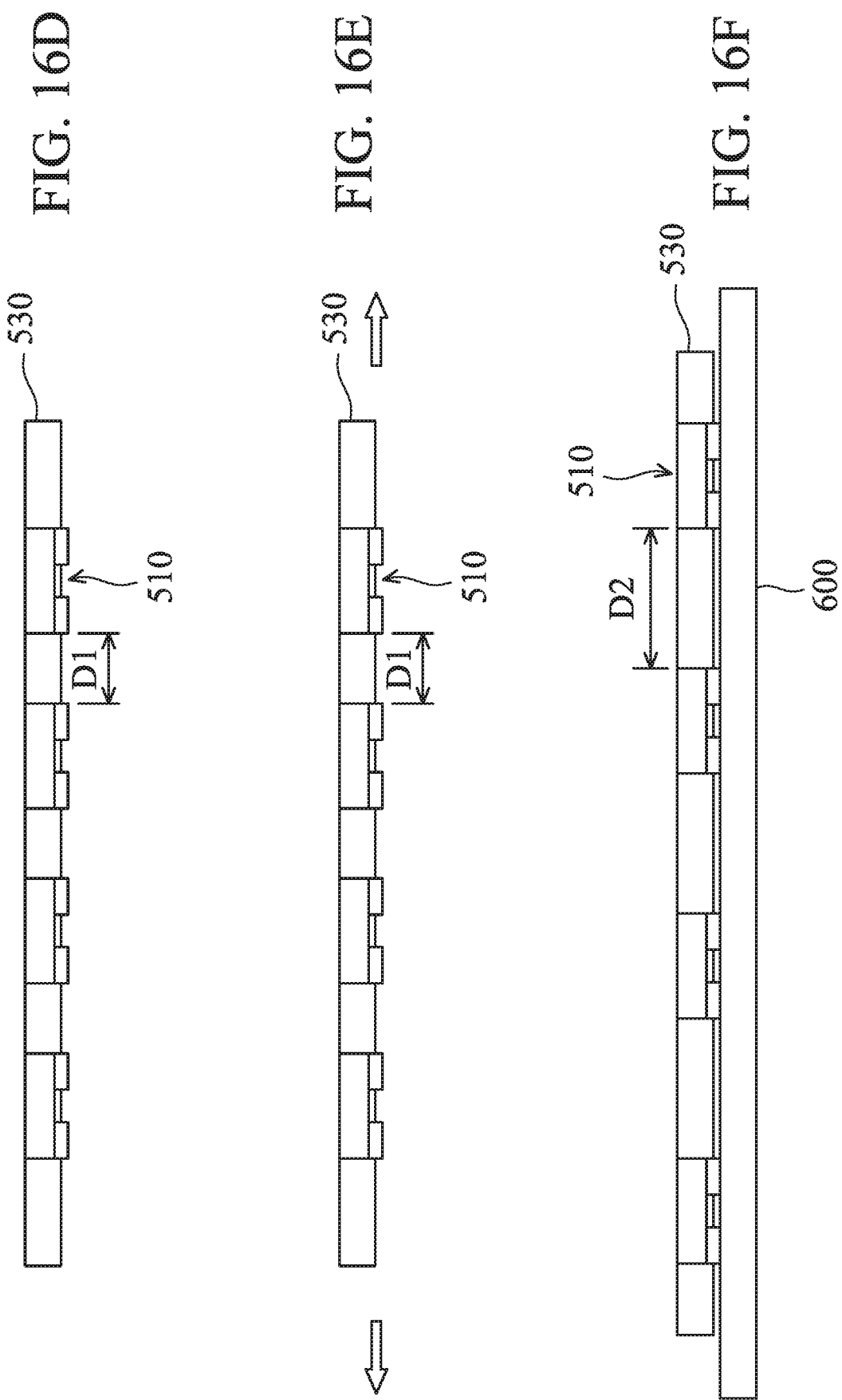

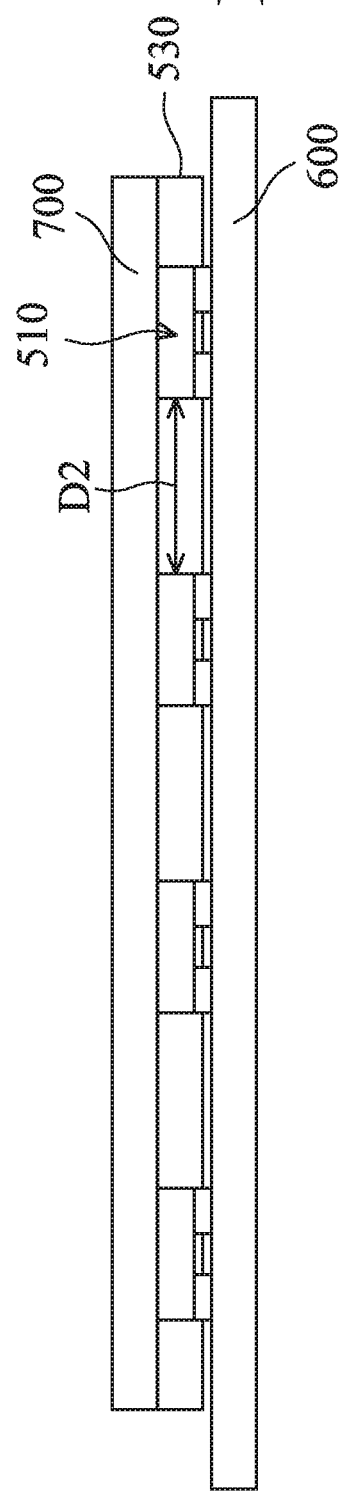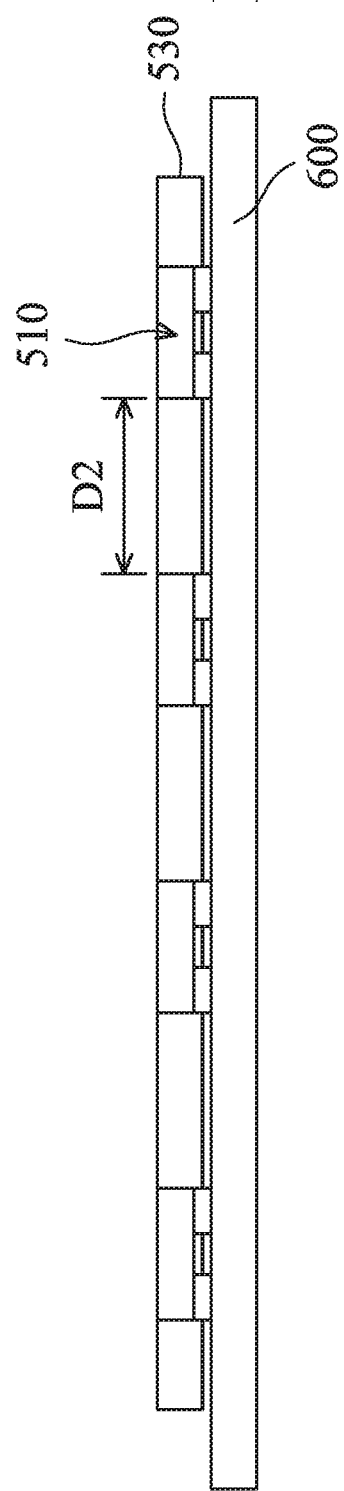

DISPLAY DEVICE

CROSS REFERENCE TO RELATED APPLICATIONS

This application is a Divisional of Ser. No. 15/916,643, filed Mar. 9, 2018, now U.S. Pat. No. 10,686,158, which claims priority of China Patent Application No. 201710813708.2 filed on Sep. 11, 2017, which claims the benefit of priority from a provisional application of U.S. Patent Application No. 62/479,326 filed on Mar. 31, 2017 and a provisional application of U.S. Patent Application No. 62/500,539 filed on May 3, 2017, the entirety of which is incorporated by reference herein.

BACKGROUND OF THE INVENTION

Field of the Invention

The embodiments of the disclosure relate to a display device, and in particular to a display device with a micro light-emitting diode.

Description of the Related Art

As digital technology develops, display devices are being used more widely in society. For example, display devices have been applied to modern information and communication devices such as televisions, notebooks, computers, mobile phones and smartphones. In addition, each generation of display devices has been developed to be thinner, lighter, smaller, and more fashionable than the previous generation. These display devices include light-emitting diode display devices.

The recombination radiation of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since mass production has recently become a trend in the light-emitting diode industry, any increase in the yield of manufacturing light-emitting diodes will reduce costs and result in huge economic benefits. However, existing display devices have not been satisfactory in every respect.

Therefore, a cost-effective display device is needed.

BRIEF SUMMARY OF THE INVENTION

The present disclosure provides a display device. The display device includes a light-emitting unit. The light-emitting unit includes a light-emitting part, wherein a light extraction structure is disposed on a first surface of the light-emitting part. The light-emitting unit also includes a connective part disposed on a second surface opposite to the first surface of the light-emitting part. The light-emitting unit further includes a protective part surrounding the light-emitting part and the connective part. In addition, the display device includes a substrate having a plurality of active elements and at least one bonding pad, wherein the bonding pad is electrically connected to the corresponding connective part of the light-emitting unit. The roughness of the light extraction structure is greater than or equal to 0.2 μm and less than or equal to 5 μm.

The present disclosure provides a display device. The display device includes a light-emitting unit. The light-emitting unit includes a light-emitting part having a first surface and a second surface opposite to the first surface. The light-emitting unit also includes a connective part adjacent to the second surface of the light-emitting part. The light-emitting unit further includes a protective part surrounding the light-emitting part and the connective part. In addition, the light-emitting unit includes a transparent structure disposed on the first surface of the light-emitting part. The display device also includes a substrate having a plurality of active elements and at least one bonding pad, wherein the bonding pad is electrically connected to the corresponding connective part of the light-emitting unit. The refractive index of the transparent structure decreases along a direction from the second surface to the first surface of the light-emitting part.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 1C is a graph of a distribution of a concentration against position of a second component of the bonding layer in accordance with some embodiments of the present disclosure;

FIGS. 16A-16F are cross-sectional views of various stages of a process for attaching a light-emitting unit to a substrate in accordance with some embodiments of the present disclosure;

FIGS. 17A-17E are cross-sectional views of various stages of a process for attaching a light-emitting unit to a substrate in accordance with some embodiments of the present disclosure;

DETAILED DESCRIPTION OF THE INVENTION

Figure 1A:
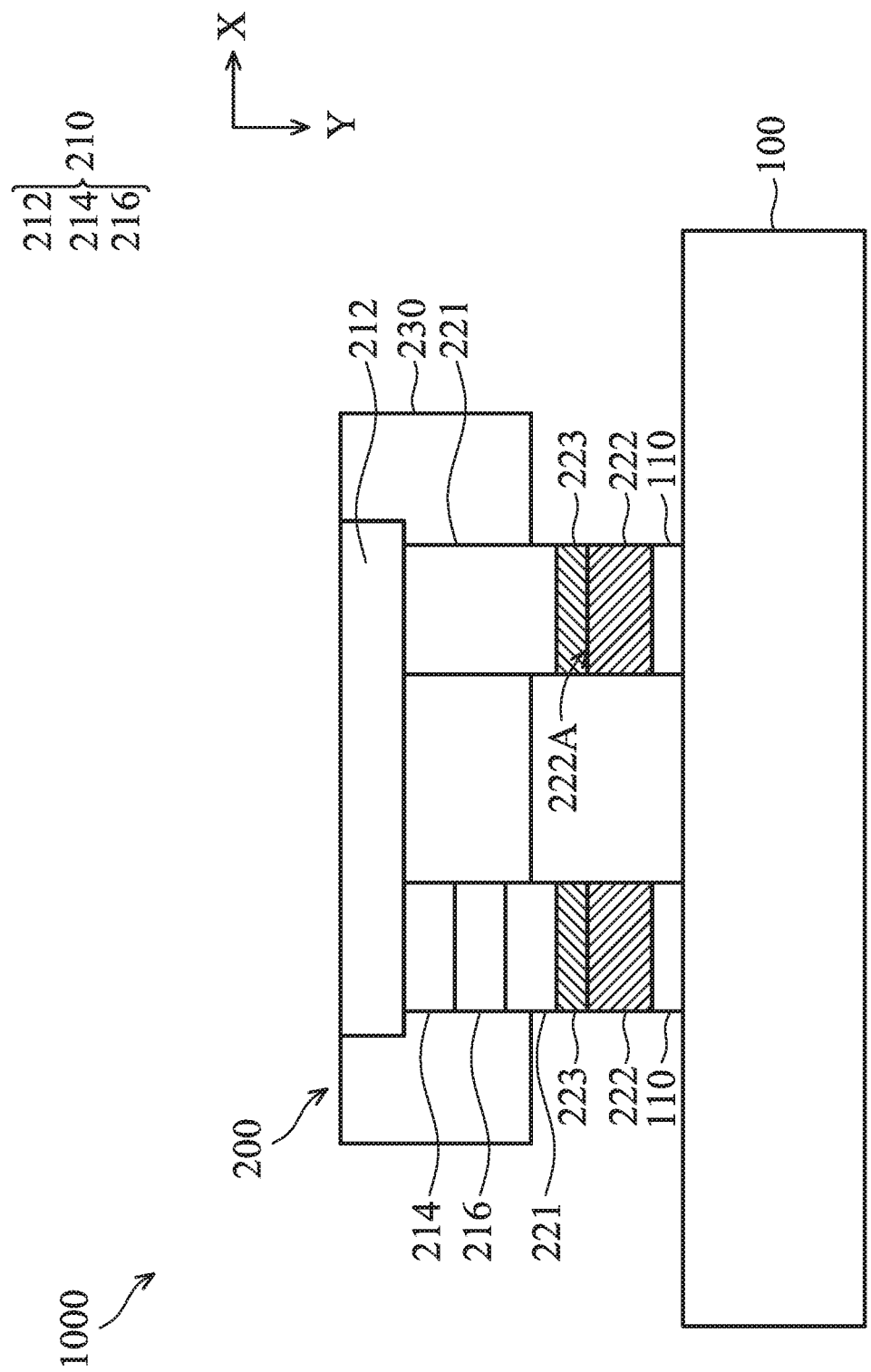
FIGS. 1A and 1B are cross-sectional views of various stages of a process for forming a display device having a bonding layer with a high melting point in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

Figure 1B:
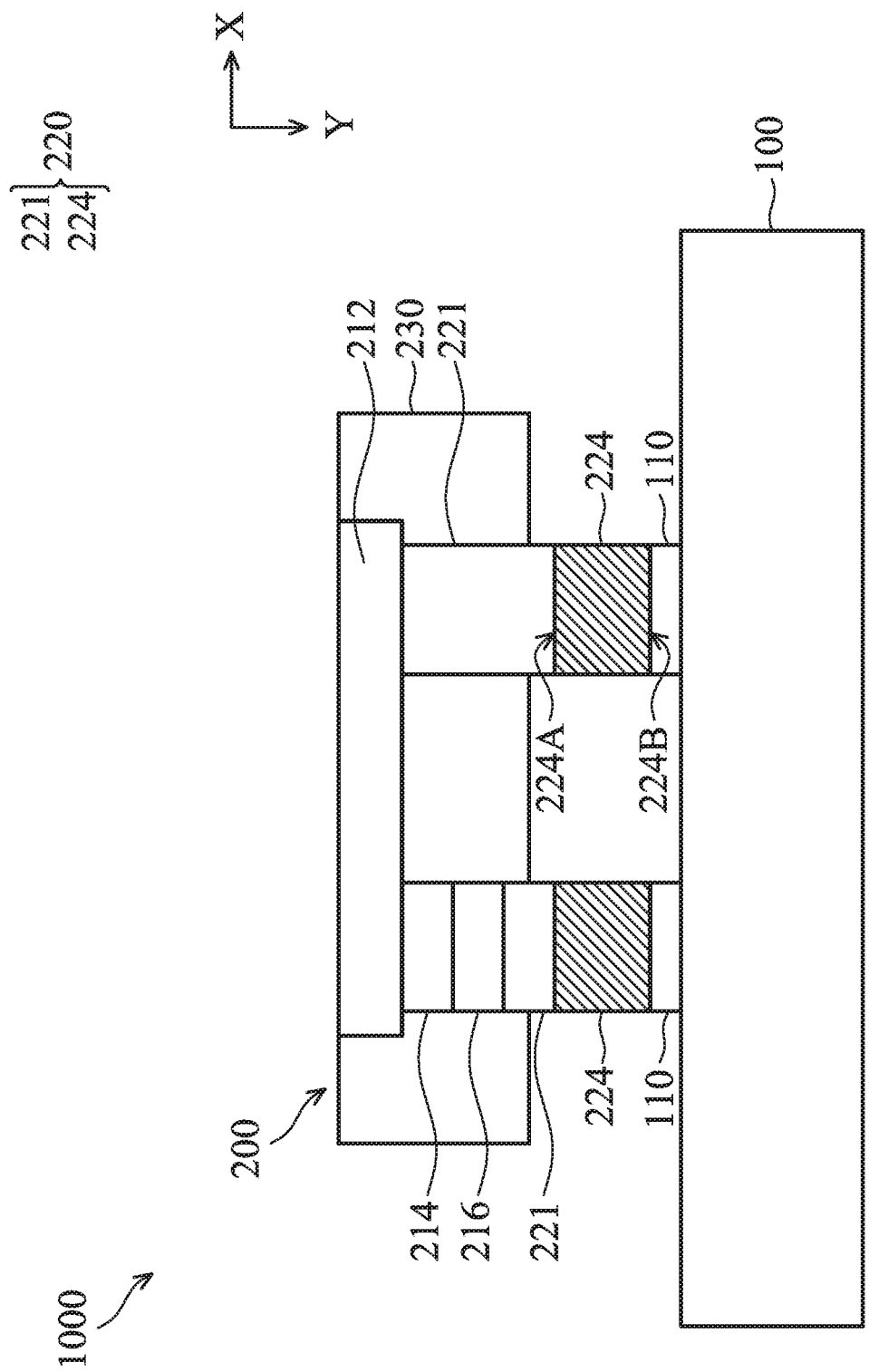

Referring to FIGS. 1A and 1B, FIGS. 1A and 1B are cross-sectional views of various stages of a process for forming a display device 1000 having a bonding layer 224 with a high melting point in accordance with some embodiments of the present disclosure. As shown in FIG. 1A, the display device 1000 includes a substrate 100 and a light-emitting unit 200 over the substrate 100. The substrate 100 includes an integrated circuit (not shown) electrically connected to the light-emitting unit 200. The integrated circuit (IC) may include, but is not limited to, a micro-processor, a memory element and/or other elements. The IC may also include various passive and active microelectronic devices, such as thin film resistors, other capacitors (e.g., metal-insulator-metal capacitor, MIMCAP), inductors, diodes, metal-oxide-semiconductor field effect transistors (MOS-FETs), complementary MOS (CMOS) transistors, bipolar junction transistors (BJTs), laterally diffused MOS (LD-MOS) transistors, high power MOS transistors, or other types of transistors.

As shown in FIG. 1A, in some embodiments, the substrate 100 includes a bonding pad 110 electrically and physically connected to the light-emitting unit 200. The materials of the bonding pad 110 may include, but is not limited to, copper, aluminum, tungsten, gold, chromium, nickel, platinum, titanium, iridium, rhodium, the above alloys, the above combination or any other applicable materials. The bonding pad 110 may be formed by a deposition process, a lithography process and an etching process. The deposition process includes, but is not limited to, chemical vapor deposition (CVD), sputtering, resistive thermal evaporation, electron beam evaporation, and any other applicable methods. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), and any other applicable methods. The lithography process includes, but is not limited to, photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include, but is not limited to, dry etching, wet etching, and other etching methods.

As shown in FIG. 1A, in some embodiments, the light-emitting unit 200 includes a light-emitting part 210, a protective part 230. In addition, the light-emitting unit 200 also includes a connective part electrically connected to the bonding pad 110 of the substrate 100, wherein the connective part includes conductive pad 221, a first material layer 222 and a second material layer 223. As shown in FIG. 1A, the light-emitting part 210 includes a semiconductor layer 212, a light-emitting layer 214 and a semiconductor layer 216. The semiconductor layer 212 and the semiconductor layer 216 adjoin the conductive pad 221. The semiconductor layer 212 and the semiconductor layer 216 may include, but are not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The semiconductor layer 212 and the semiconductor layer 216 may also include, but are not limited to, metal oxide such as indium gallium zinc oxide (IGZO), indium zinc oxide (IZO), indium gallium zinc oxide (IGZTO), or organic semiconductor including polycyclic aromatic compound, or a combination thereof.

As shown in FIG. 1A, the light-emitting layer 214 is disposed between the semiconductor layer 212 and the semiconductor layer 216. The light-emitting layer 214 may include, but is not limited to, homojunction, heterojunction, single-quantum well (SQW), multiple-quantum well (MQW) or any other applicable structure. In some embodiments, the light-emitting layer light-emitting layer 214 includes un-doped n type $In_xGa_{(1-x)}N$. In other embodiments, the light-emitting layer light-emitting layer 214 includes such materials as $Al_xIn_yGa_{(1-x-y)}N$ and other materials. Moreover, the light-emitting layer light-emitting layer 214 may include a multiple-quantum well structure with multiple-quantum layers (such as InGaN) and barrier layers (such as GaN) arranged alternately. Moreover, the light-emitting layer light-emitting layer 214 may be formed by metal organic chemical vapor deposition (MOCVD), molecular beam epitaxy (MBE), hydride vapor phase epitaxy (HVPE), liquid phase epitaxy (LPE) or any other applicable chemical vapor deposition process.

As shown in FIG. 1A, the protective part 230 is disposed on sidewalls of the light-emitting part 210, and surrounds the light-emitting part 210 and the conductive pad 221. The protective part 230 is disposed over at least some regions of the light-emitting path, the light-emitting shape may be altered or the light-emitting effectiveness may be improved. In some embodiments, the material of the protective part 230 may be a metal material, and may be the same as or similar to that of the bonding pad 110.

As shown in FIG. 1A, the conductive pad 221 is adjacent to the light-emitting part 210. The material of the conductive pad 221 may include, but is not limited to, copper, aluminum, tungsten, gold, chromium, nickel, platinum, titanium, iridium, rhodium, the above alloys, the above combination or any other applicable materials.

As shown in FIG. 1A, the first material layer 222 is adjacent to the bonding pad 110. The material of the first material layer 222 may be an alloy with low melting point. In some embodiments, the first material layer 222 is a eutectic material whose melting point is smaller than 300° C. The material of the first material layer 222 may include, but is not limited to, a tin-indium alloy, a tin-zinc alloy, a tin-silver alloy, a gold-indium alloy, a gold-tin alloy or other suitable materials.

As shown in FIG. 1A, in some embodiments, the light-emitting unit 200 further includes a second material layer 223 disposed between the conductive pad 221 and the first material layer 222. The second material layer 223 may be used as a buffer layer. In some embodiments, the first material layer 222 will congruent melt with the second material layer 223 after a heating process and a compression process are subsequently performed on the display device 1000. As a result, a bonding layer with a melting point higher than the first material layer 222 is formed. In some embodiments, the second material layer 223 may be a single layer structure such as gold, silver, copper, nickel, platinum, tin or an alloy mentioned above. In some embodiments, the second material layer 223 may be a multi-layer stack structure such as copper-nickel-gold structure or a copper-nickel-platinum-gold structure.

In some embodiments, a heating process and a compression process are performed on the structure shown in FIG. 1A. Afterwards, the first material layer 222 congruent melts with the second material layer 223. During the heating process and the compression process, the material of the second material layer 223 diffuses into the first material layer 222 through a first surface 222A of the first material layer 222. As a result, the structure shown in FIG. 1B is formed. In some embodiments, the temperature of the heating process is between about 100° C. and about 400° C. In some embodiments, the pressure of the compression process is between about 0.1 MPa and about 100 MPa.

Referring to FIG. 1B, after the heating process and compression process are performed on the structure shown in FIG. 1A, the first material layer 222 and the second material layer 223 form a bonding layer 224. In some embodiments, the bonding layer 224 includes a first component from the first material layer 222 and a second component from the second material layer 223. In addition, the melting point of the bonding layer 224 is higher than that of the first material layer 222. In some embodiments, the melting point of the bonding layer 224 is between about 100° C. and about 500° C. In some embodiments, the melting point of the bonding layer 224 is between about 350° C. and about 400° C. In some embodiments, the melting point of the bonding layer 224 is between about 100° C. and about 350° C.

Furthermore, since the material of the second material layer 223 diffuses into the first material layer 222 through the first surface 222A, the material of the second material layer 223 does not disperse in the bonding layer 224 uniformly. Namely, the second component does not disperse in the bonding layer 224 uniformly. Next, referring to FIGS. 1B and 1C, FIG. 1C is a graph of a distribution of a second concentration along a direction from the first surface 224A to a second surface 224B of the bonding layer 224 (such as Y-direction) in accordance with some embodiments of the present disclosure. As shown in FIG. 1C, the concentration of the second component decreases along the direction from the first surface 224A to the second surface 224B of the bonding layer 224. Moreover, the concentration (not shown) of the first component increases from the first surface 224A to the second surface 224B of the bonding layer 224. Therefore, the distribution of the concentration of the first component is contrary to that of the second component.

In FIG. 1C, the maximum concentration of the second component is defined as 100, and it is defined as 0 when there is no second component. Since the second material layer 223 is disposed above the first material layer 222, the second component has a maximum at an interface between the first material layer 222 and the second material layer 223 (e.g. the first surface 224A of the bonding layer 224) and a minimum at an interface between the first material layer 222 and the bonding pad 110 (e.g. the second surface 224B of the bonding layer 224). Although FIG. 1C illustrates that the second component is zero at the second surface 224B of the bonding layer 224, embodiments of the disclosure are not limited thereto. In some other embodiments, the second component is not zero at the second surface 224B of the bonding layer 224.

As shown in FIG. 1B, the bonding layer 224 and the conductive pad 221 can be used as a connective part 220 of the light-emitting unit 200. Since the bonding layer 224 has high melting point, it prevents the connective part 220 from being damaged due to the high temperature of the subsequent process so that the light-emitting unit 200 is not electrically connected to the substrate 100. Therefore, the formation of the bonding layer 224 can improve the yield of the display device 1000.

Figure 2A:
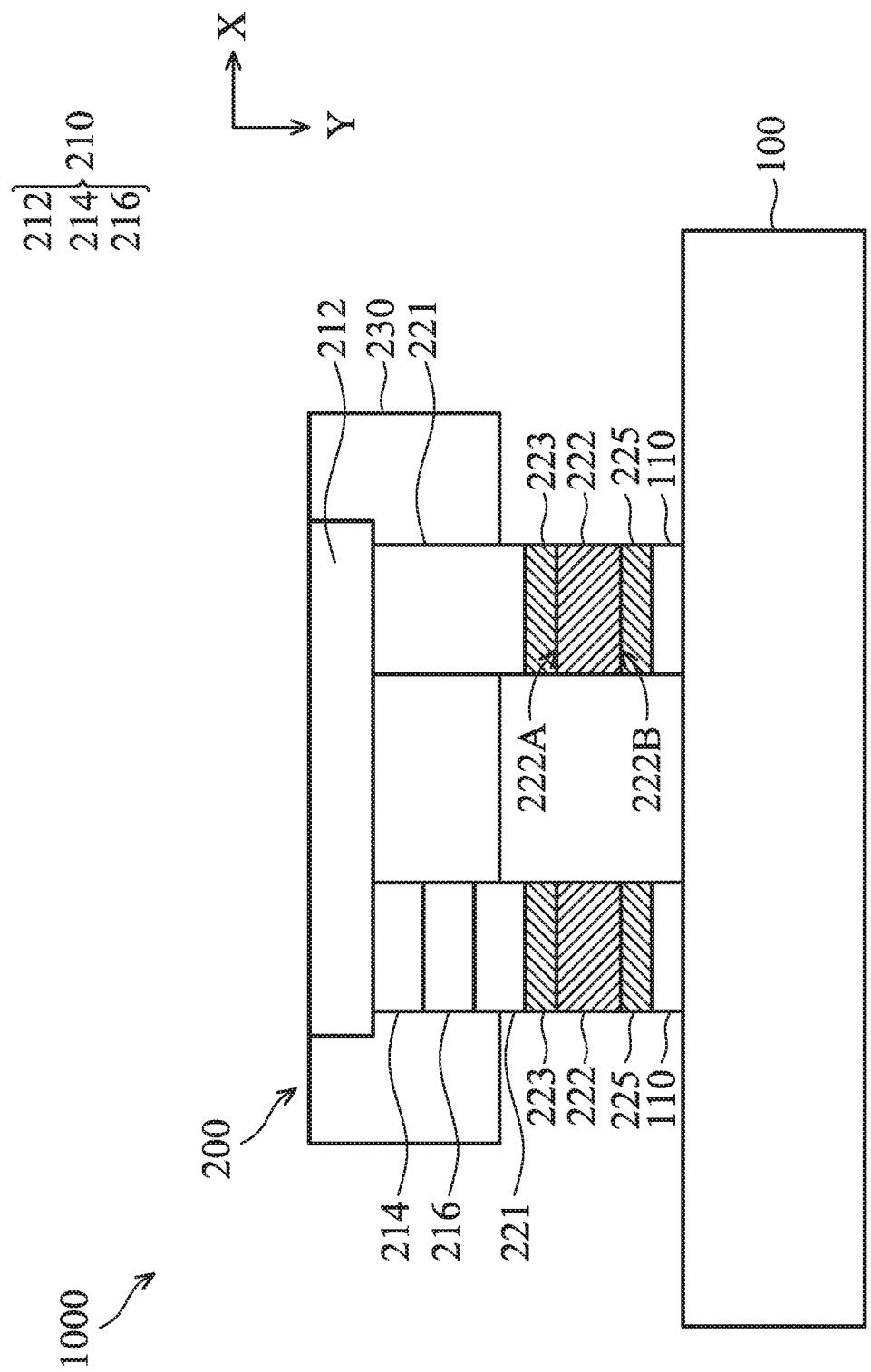
FIGS. 2A and 2B are cross-sectional views of various stages of a process for forming a display device having a bonding layer with a high melting point in accordance with some embodiments of the present disclosure.
Figure 2B:
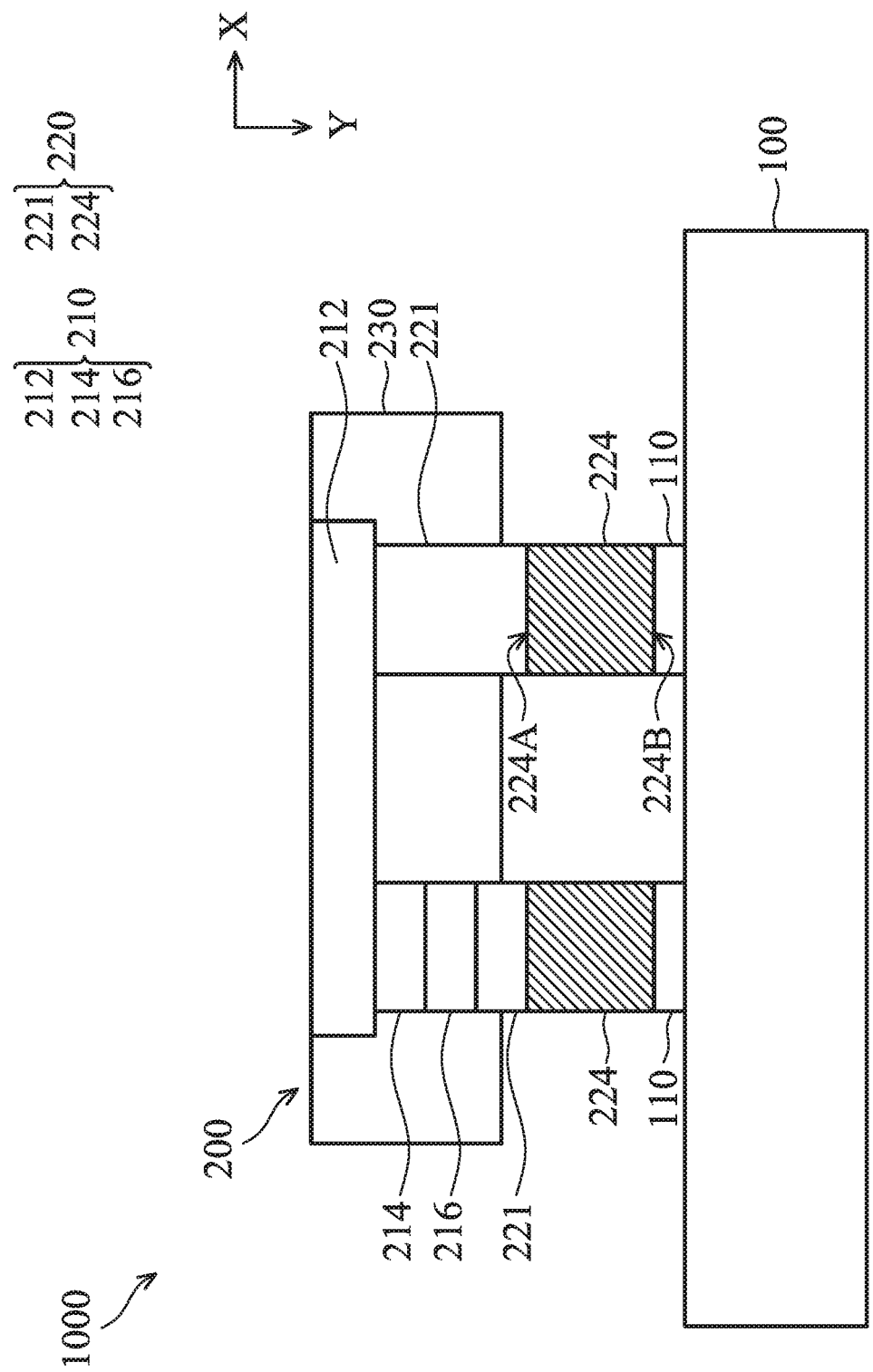

Referring to FIGS. 2A and 2B, FIGS. 2A and 2B are cross-sectional views of various stages of a process for forming a display device 1000 having a bonding layer 224 with a high melting point in accordance with some embodiments of the present disclosure. In some embodiments, as shown in FIG. 2A, the display device 1000 includes the second material layer 223 on the first surface 222A of the first material layer 222 and a third material layer 225 on the second surface 222B of the first material layer 222. In some embodiments, the third material layer 225 includes, but is not limited to, copper, aluminum, molybdenum, tungsten, gold, chromium, nickel, platinum, titanium, iridium, rhodium, the above alloys, a combination thereof, or another electrically conductive metal material. In some embodiments, the material of the third material layer 225 is the same as that of the second material layer 223. In some embodiments, the material of the third material layer 225 is different from that of the second material layer 223. In some embodiments, the third material layer 225 may be a single layer structure or a multi-layer stack structure.

Next, in some embodiments, a heating process and a compression process are performed on the structure shown in FIG. 2A. Afterwards, the first material layer 222 and the second material layer 223 congruent melt with the third material layer 225. During the heating process and the compression process, the material of the second material layer 223 diffuses into the first material layer 222 through the first surface 222A of the first material layer 222, and the material of the third material layer 225 diffuses into the first material layer 222 through the second surface 222B of the first material layer 222. As a result, the structure shown in FIG. 2B is formed. In some embodiments, the temperature of the heating process is between about 100° C. and about 400° C. In some embodiments, the pressure of the compression process is between about 0.1 MPa and about 100 MPa.

Referring to FIG. 2B, after the heating process and compression process are performed on the structure shown in FIG. 2A, the first material layer 222, the second material layer 223 and the third material layer 225 form the bonding layer 224. In some embodiments, the bonding layer 224 includes the first component from the first material layer 222 and the second component from the second material layer 223 and the third material layer 225. In addition, the melting point of the bonding layer 224 is higher than that of the first material layer 222. In some embodiments, the melting point of the bonding layer 224 is between about 100° C. and about 500° C. In some embodiments, the melting point of the bonding layer 224 is between about 350° C. and about 400° C. In some embodiments, the melting point of the bonding layer 224 is between about 100° C. and about 350° C.

Figure 2C:
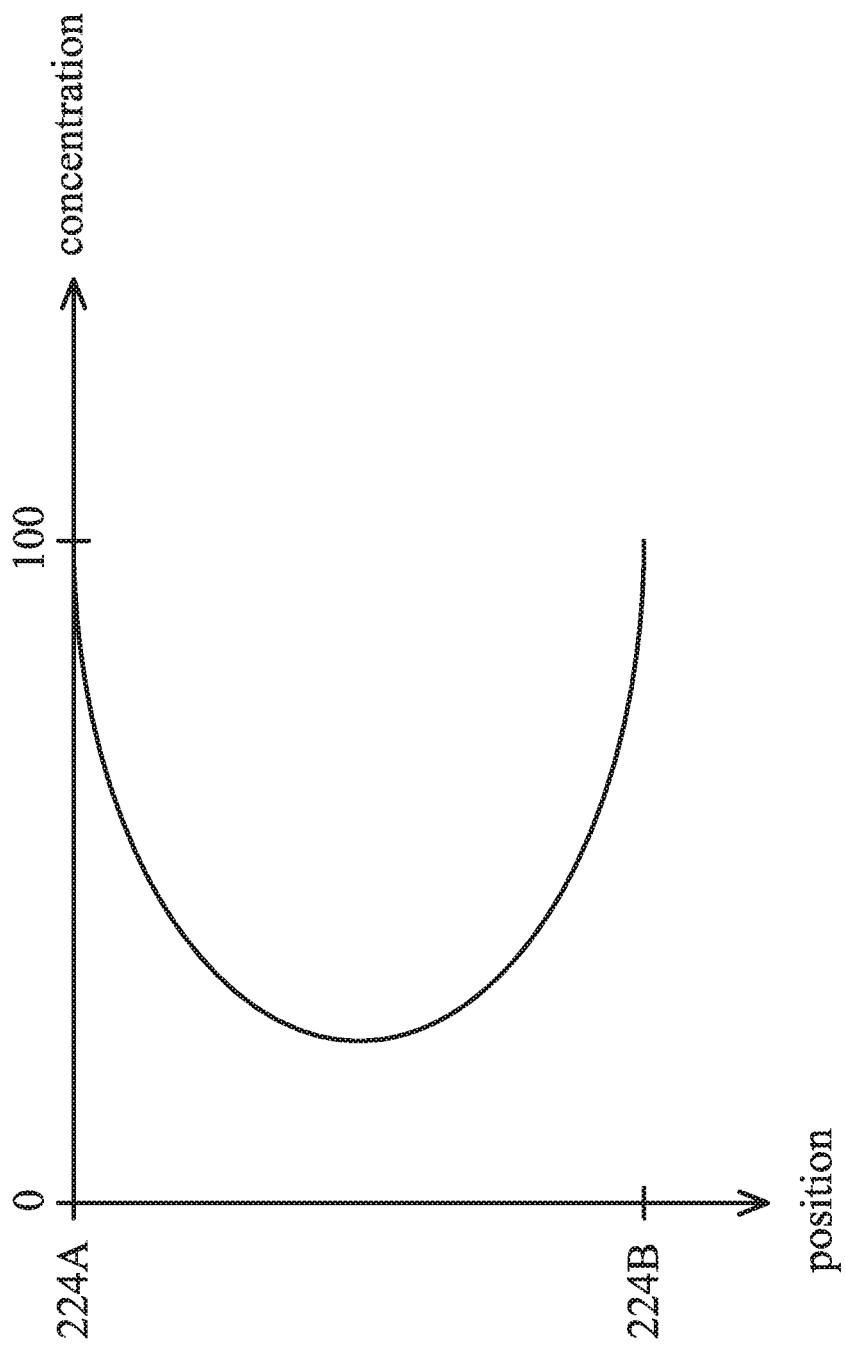
FIG. 2C is a graph of a distribution of a concentration against position of a second component of the bonding layer in accordance with some embodiments of the present disclosure.

Furthermore, since the material of the second material layer 223 diffuses into first material layer 222 through the first surface 222A and the material of the third material layer 225 diffuses into first material layer 222 through the second surface 222B, the materials of the second material layer 223 and the third material layer 225 do not disperse in the bonding layer 224 uniformly. Namely, the second component does not disperse in the bonding layer 224 uniformly. Next, referring to FIGS. 2B and 2C, FIG. 2C is a graph of a distribution of a second concentration along the direction from the first surface 224A to the second surface 224B of the bonding layer 224 in accordance with some embodiments of the present disclosure. As shown in FIG. 2C, when the material of the second material layer 223 is the same as that of the third material layer 225, the concentration of the second component does not increase, nor does it decrease along the direction from the first surface 224A to the second surface 224B of the bonding layer 224.

In FIG. 2C, the maximum concentration of the second component is defined as 100, and it is defined as 0 when there is no second component. Since the second material layer 223 is disposed above the first material layer 222 and the third material layer 225 is disposed under the first material layer 222, the second component has a maximum at the interface between the first material layer 222 and the second material layer 223 (e.g. the first surface 224A of the bonding layer 224) and at an interface between the first material layer 222 and the third material layer 225 (e.g. the second surface 224B of the bonding layer 224). In addition. The second component has a minimum between the first surface 224A and the second surface 224B. Although FIG. 2C illustrates that it has the same concentration of the second component at the first surface 224A and the second surface 224B of the bonding layer 224, embodiments of the disclosure are not limited thereto. In some other embodiments, the concentration of the second component at the first surface 224A is different from that of the second surface 224B.

Figure 3A:
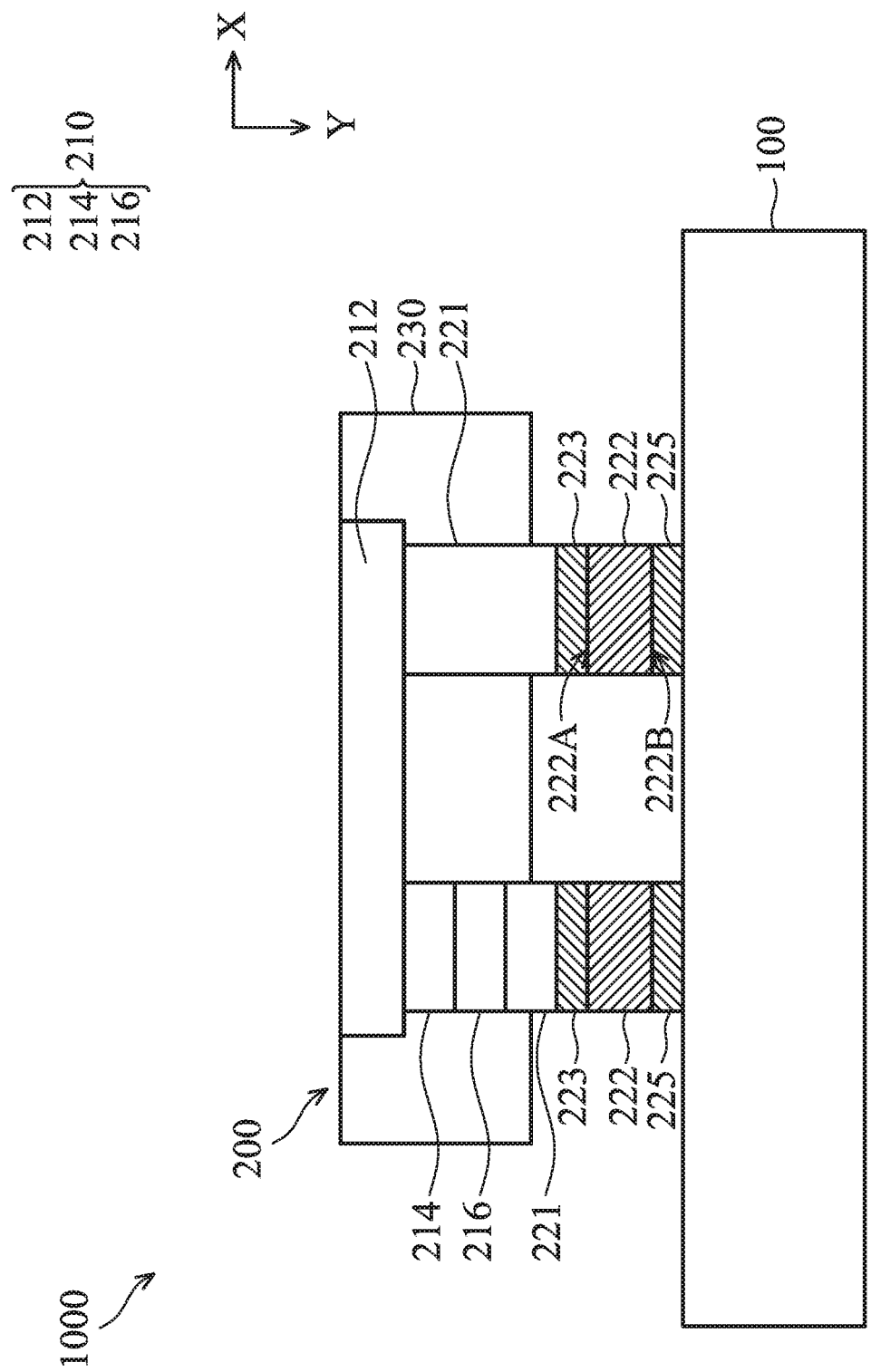
FIGS. 3A and 3B are cross-sectional views of various stages of a process for forming a display device having a bonding layer with a high melting point in accordance with some embodiments of the present disclosure.
Figure 3B:
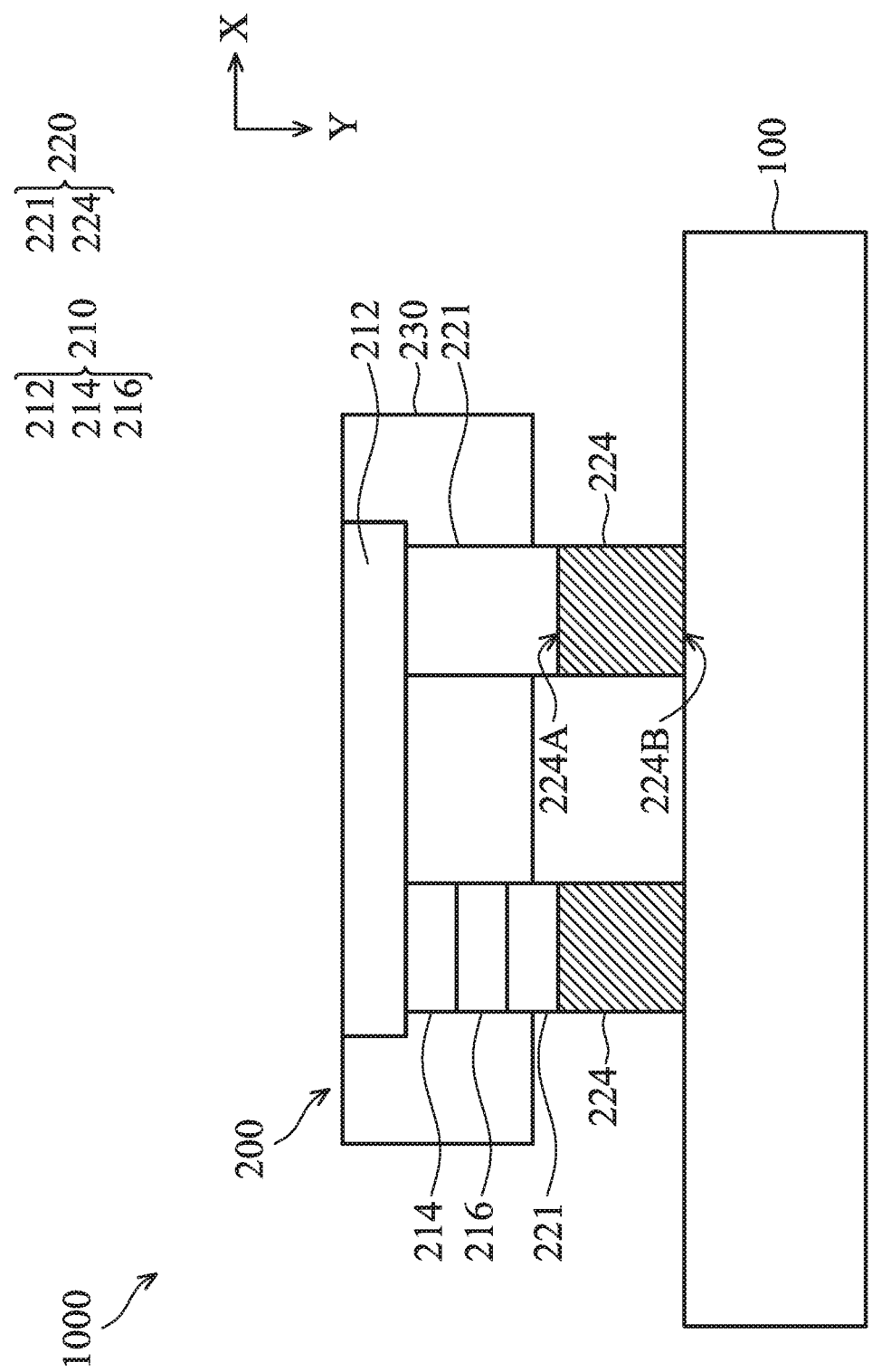

Referring to FIGS. 3A and 3B, FIGS. 3A and 3B are cross-sectional views of various stages of a process for forming a display device 1000 having a bonding layer 224 with a high melting point in accordance with some embodiments of the present disclosure. In some embodiments, as shown in FIG. 3A, the bonding pad 110 of the substrate 100 can be replaced by the third material layer 225.

Referring to FIG. 3B, after the heating process and compression process are performed on the structure shown in FIG. 3A, the first material layer 222, the second material layer 223 and the third material layer 225 form the bonding layer 224. In some embodiments, the bonding layer 224 includes the first component from the first material layer 222 and the second component from the second material layer 223 and the third material layer 225. In addition, the melting point of the bonding layer 224 is higher than that of the first material layer 222. In some embodiments, the melting point of the bonding layer 224 is between about 100° C. and about 500° C. In some embodiments, the melting point of the bonding layer 224 is between about 350° C. and about 400° C. In some embodiments, the melting point of the bonding layer 224 is between about 100° C. and about 350° C.

Figure 3C:
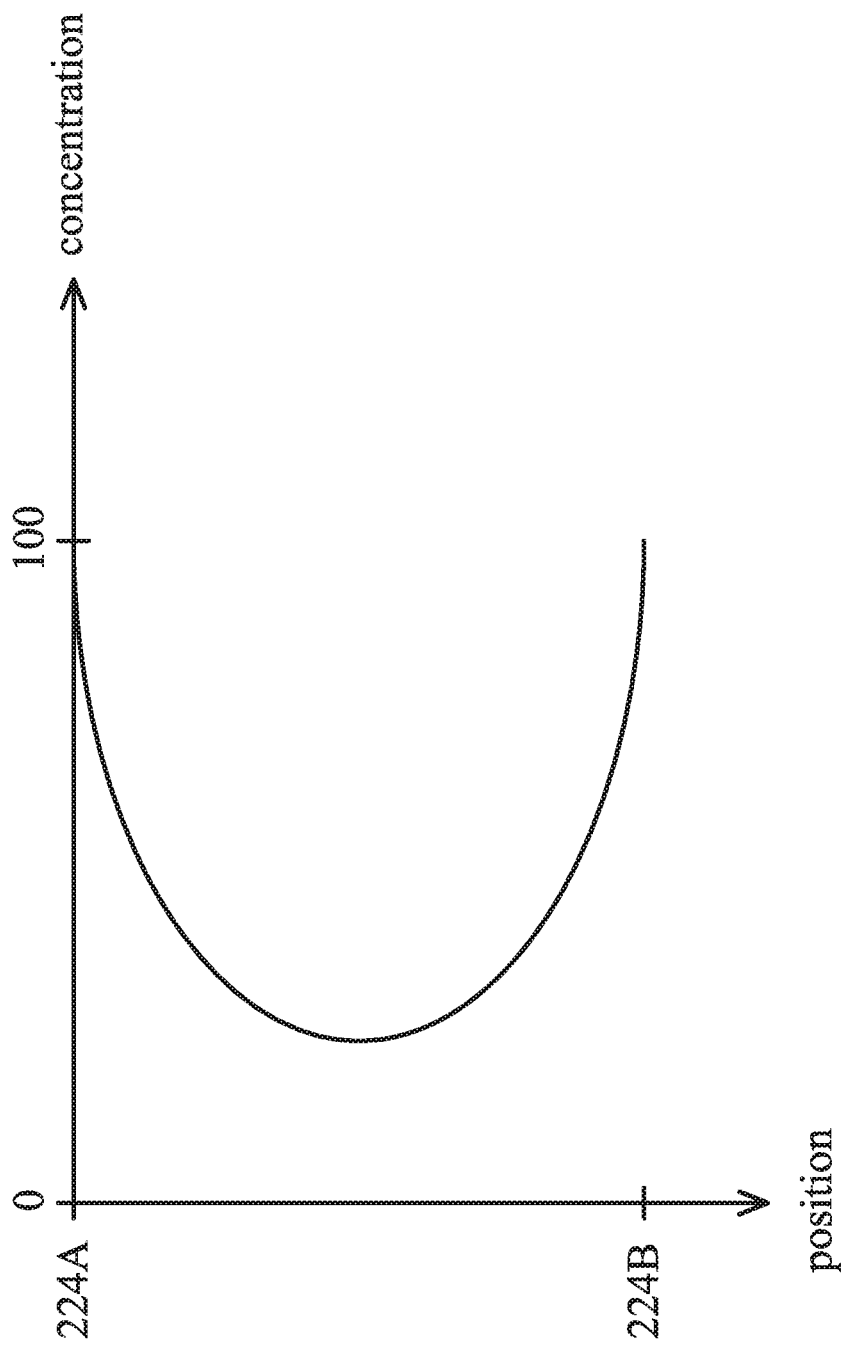
FIG. 3C is a graph of a distribution of a concentration against position of a second component of the bonding layer in accordance with some embodiments of the present disclosure.

Furthermore, since the material of the second material layer 223 diffuses into first material layer 222 through the first surface 222A and the material of the third material layer 225 diffuses into first material layer 222 through the second surface 222B, the materials of the second material layer 223 and the third material layer 225 do not disperse in the bonding layer 224 uniformly. Namely, the second component does not disperse in the bonding layer 224 uniformly. Next, referring to FIGS. 3B and 3C, FIG. 3C is a graph of a distribution of a second concentration along the direction from the first surface 224A to the second surface 224B of the bonding layer 224 in accordance with some embodiments of the present disclosure. As shown in FIG. 3C, when the material of the second material layer 223 is the same as that of the third material layer 225, the concentration of the second component does not increase, nor does it decrease along the direction from the first surface 224A to the second surface 224B of the bonding layer 224.

In FIG. 3C, the maximum concentration of the second component is defined as 100, and it is defined as 0 when there is no second component. Since the second material layer 223 is disposed above the first material layer 222 and the third material layer 225 is disposed under the first material layer 222, the second component has a maximum at the interface between the first material layer 222 and the second material layer 223 (e.g. the first surface 224A of the bonding layer 224) and at an interface between the first material layer 222 and the third material layer 225 (e.g. the second surface 224B of the bonding layer 224). In addition. The second component has a minimum between the first surface 224A and the second surface 224B. Although FIG. 3C illustrates that it has the same concentration of the second component at the first surface 224A and the second surface 224B of the bonding layer 224, embodiments of the disclosure are not limited thereto. In some other embodiments, the concentration of the second component at the first surface 224A is different from that of the second surface 224B.

In some embodiments, since the bonding pad of the substrate congruent melts with the first material directly, the steps of the manufacturing can be simplified. Therefore, the yield of forming the display device 1000 is improved and the cost is decreased. In addition, in this embodiment, there is no boundary substantially between the bonding pad and the bonding pad.

In some embodiments, the light-emitting unit 200 is a micro light-emitting diode (μLED). For example, in some embodiments, as shown in FIG. 1A, the sum of the thickness of the semiconductor layer 212, the light-emitting layer 214 and the semiconductor layer 216 is between about 1 μm and 20 μm. In some embodiments, the sum of the thickness of the semiconductor layer 212, the light-emitting layer 214 and the semiconductor layer 216 is between about 3 μm and 10 μm. In some embodiments, the sum of the thickness of the semiconductor layer 212, the light-emitting layer 214 and the semiconductor layer 216 is between about 3 μm and 5 μm.

Figure 4:
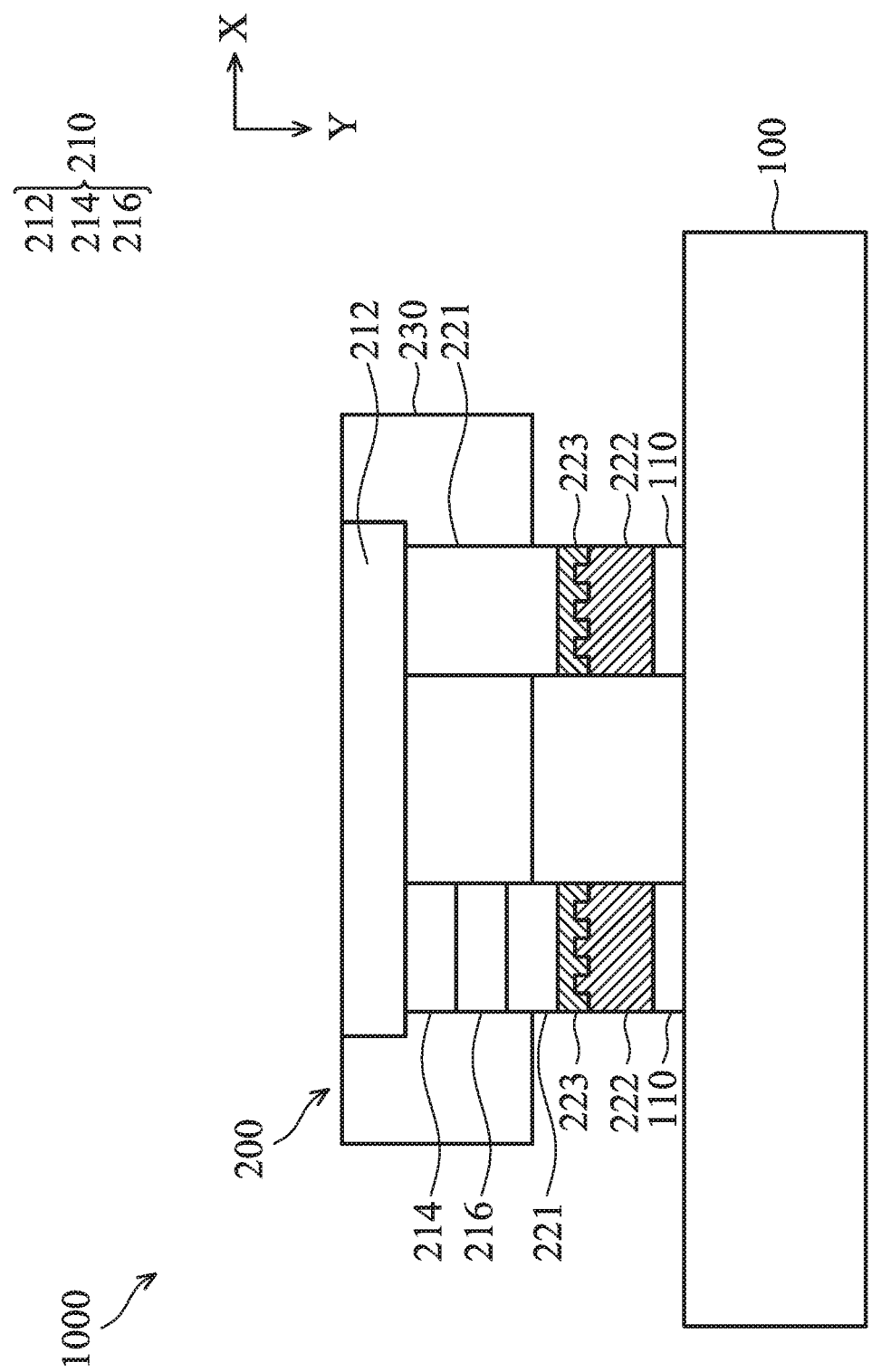
FIG. 4 is a cross-sectional view of a display device in accordance with some embodiments of the present disclosure.

Referring to FIG. 4, FIG. 4 is a cross-sectional view of the display device 1000 in accordance with some embodiments of the present disclosure. In some embodiments, a surface adjacent to the first material layer 222 of the second material layer 223 has a concave-convex structure. In some embodiments, after a heating process and a compression process are performed on a structure shown in FIG. 4, the distribution of the concentration of the second component is non-uniform not only along Y direction but also along X direction. Although FIG. 4 illustrates the pitches of the concave-convex structure are the same, embodiments of the disclosure are not limited thereto. In some embodiments, the pitches of the concave-convex structure are random. Moreover, the shape of the concave-convex structure may be random.

Figure 5:
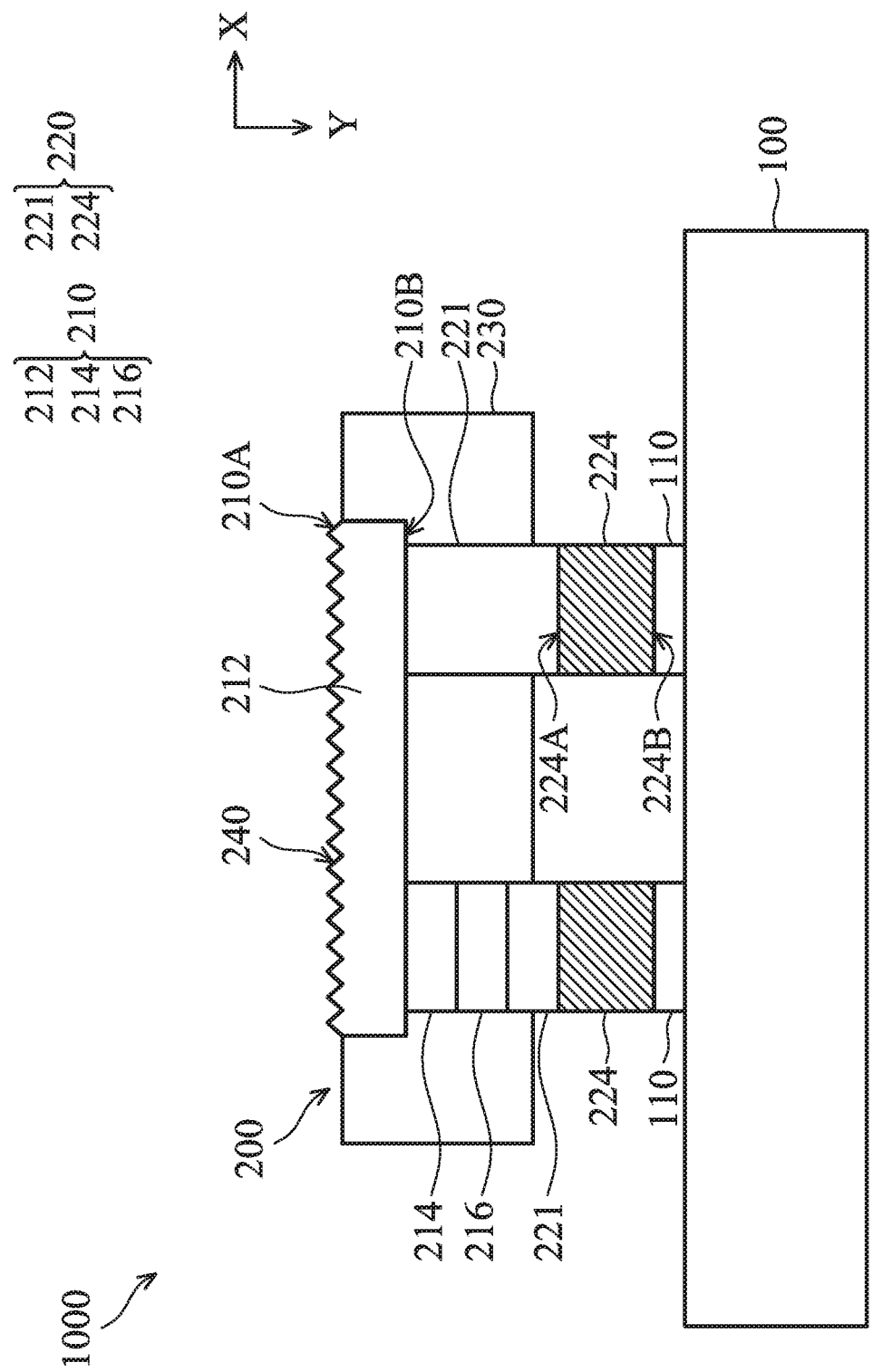
FIG. 5 is a cross-sectional view of a display device in accordance with some embodiments of the present disclosure.

Referring to FIG. 5, FIG. 5 is a cross-sectional view of the display device 1000 in accordance with some embodiments of the present disclosure. In some embodiments, as shown in FIG. 5, the light-emitting part 210 has a light extraction structure 240 on the first surface 210A. In some embodiments, the light extraction structure 240 is formed by performing an etching process on the first surface 210A of the semiconductor layer 212 of the light-emitting part 210 directly. Therefore, the material of the light extraction structure 240 is the same as that of the semiconductor layer 212. Although FIG. 5 illustrates the pitches of the light extraction structure 240 are the same, embodiments of the disclosure are not limited thereto. In some embodiments, the pitches of the light extraction structure 240 are random. Moreover, the shape of the light extraction structure 240 may be random. In some embodiments, the roughness of the light extraction structure 240 is greater than or equal to 0.2 μm and less than or equal to 5 μm. In this embodiment, after the surface of the semiconductor layer 212 of the light-emitting part 210 (e.g. the first surface 210A) is roughened, the performance of the light-extraction is improved.

Figure 6:
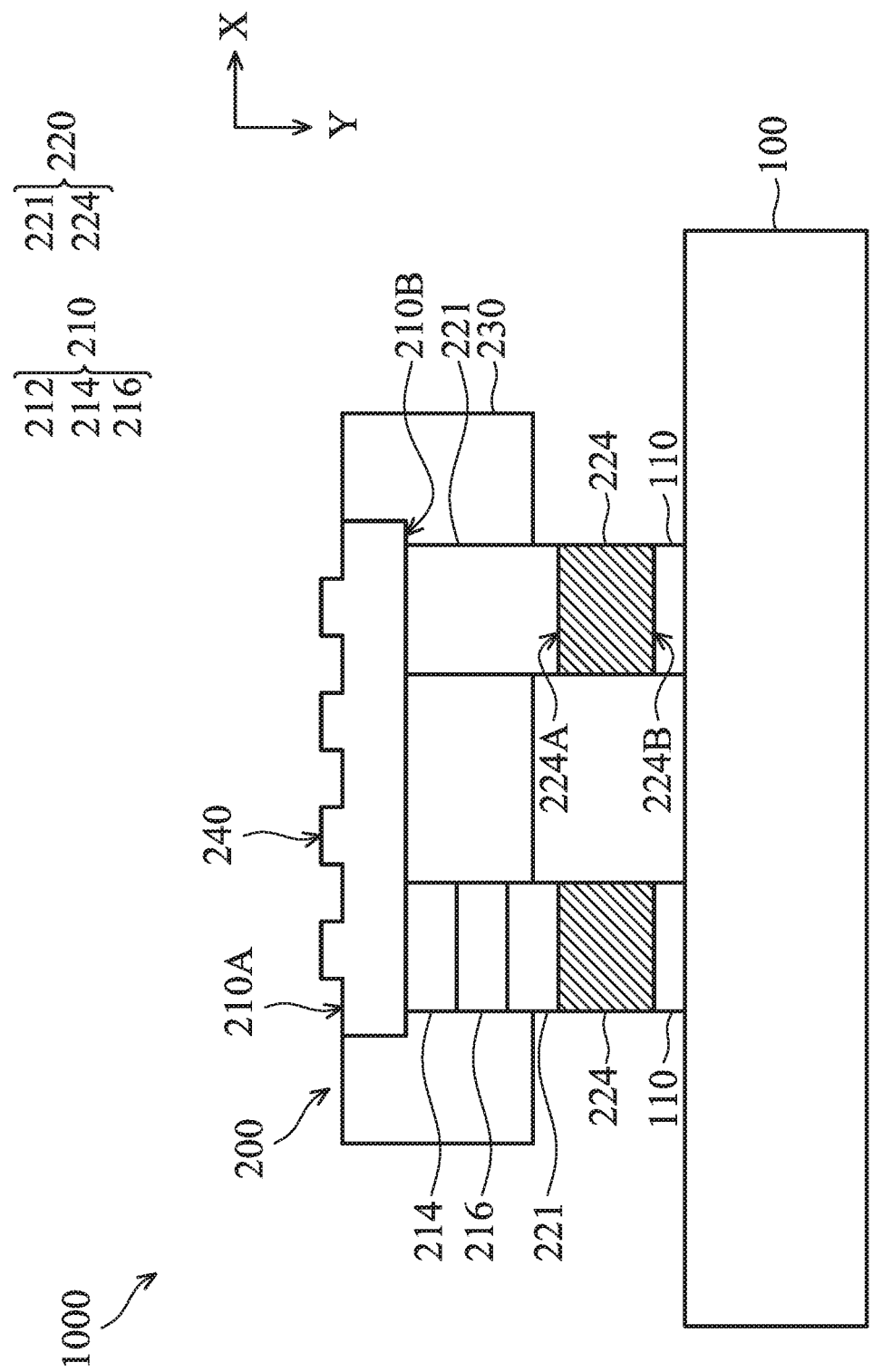
FIG. 6 is a cross-sectional view of a display device in accordance with some embodiments of the present disclosure.

Referring to FIG. 6, FIG. 6 is a cross-sectional view of the display device 1000 in accordance with some embodiments of the present disclosure. In some embodiments, as shown in FIG. 6, the material of the light extraction structure 240 over the first surface 210A of the light-emitting part 210 is not the same as that of the semiconductor layer 212. In some embodiments, a material layer (not shown) is deposited on the first surface 210A of the light-emitting part 210, and an etching process is performed on the material layer. Afterwards, the light extraction structure 240 is formed. Although FIG. 6 illustrates the pitches of the light extraction structure 240 are the same, embodiments of the disclosure are not limited thereto. In some embodiments, the pitches of the light extraction structure 240 are random.

In some embodiments, the refractive index of the light extraction structure 240 is smaller than 2.4, and smaller than that of the light-emitting part 210. In some embodiments, the light extraction structure 240 is a transparent material such as indium tin oxide (ITO), tin oxide (TO), indium zinc oxide (IZO), indium gallium oxide (IGZO), indium tin zinc oxide (ITZO), antimony tin oxide (ATO), antimony zinc oxide (AZO), the above combination or any other applicable transparent conductive oxide material. In some embodiments, the light extraction structure 240 is a macromolecular material whose refractive index is smaller than 2.4. For example, the macromolecular material may include, but is not limited to, optical resin, epoxy, silicone. In this embodiment, the performance of the light-extraction of the light-emitting part 210 is improved after the formation of the material layer with small refractive index on the first surface 210A of the light-emitting part 210.

Figure 7:
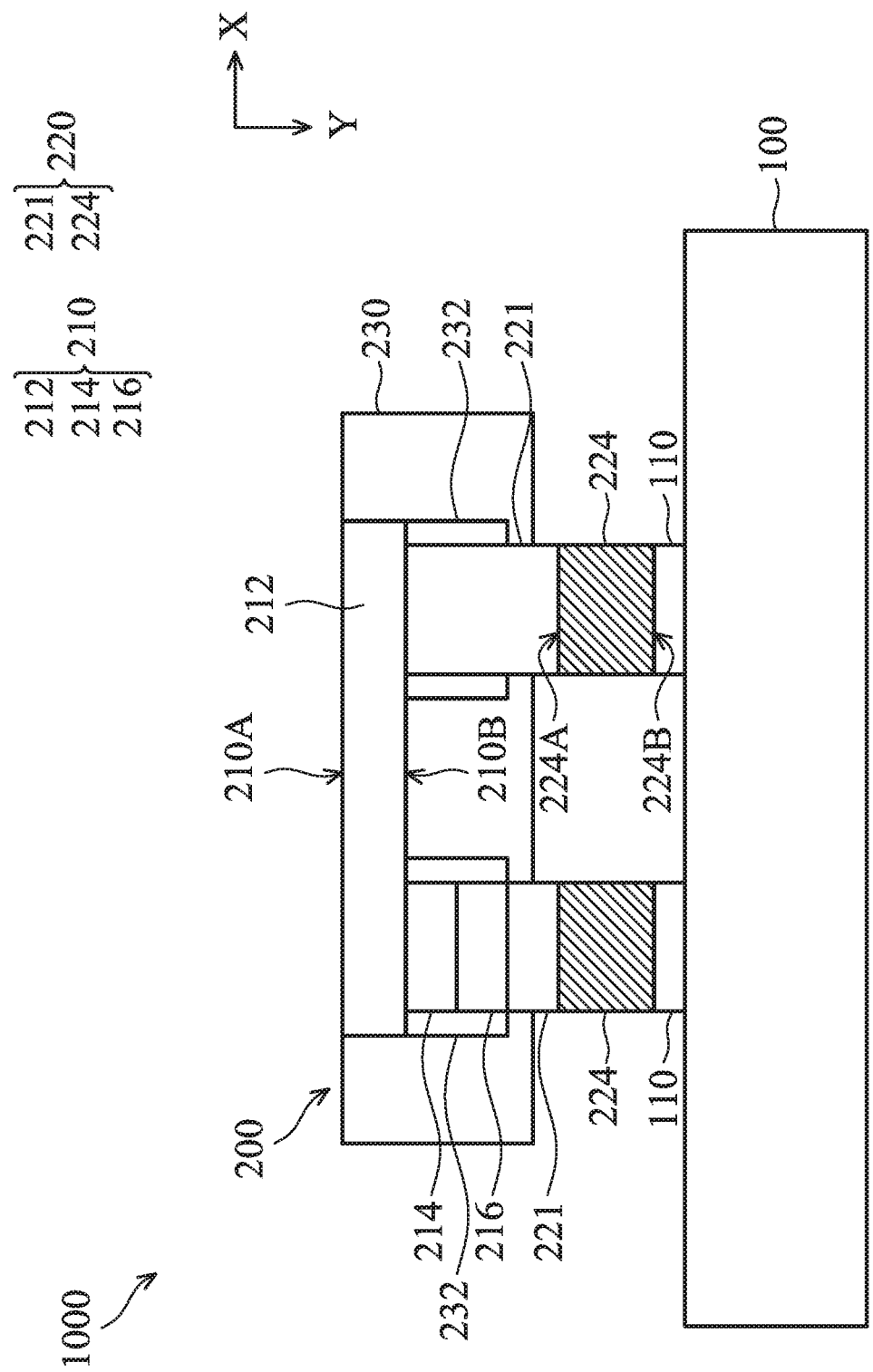
FIG. 7 is a cross-sectional view of a display device in accordance with some embodiments of the present disclosure.

Referring to FIG. 7, FIG. 7 is a cross-sectional view of the display device 1000 in accordance with some embodiments of the present disclosure. In some embodiments, as shown in FIG. 7, the protective part 230 of the light-emitting unit 200 further includes a reflective layer 232. The reflective layer 232 is disposed under the second surface 210B of the light-emitting part 210, and on sidewalls of the semiconductor layer 216, the semiconductor layer 216 and a portion of the conductive pad 221. The reflective layer 232 may be a Bragg reflector or an Omni-directional reflector (ODR). The material of the reflective layer 232 may include non-metal material, insulating material or white photoresist. In some embodiments, the material of the reflective layer 232 is a low refractive insulating material such as silicon dioxide or a high refractive insulating material such as silicon nitride or titanium dioxide. The refractive index of the reflective layer 232 may be modified and is not limited to the materials mentioned above.

Figure 8:
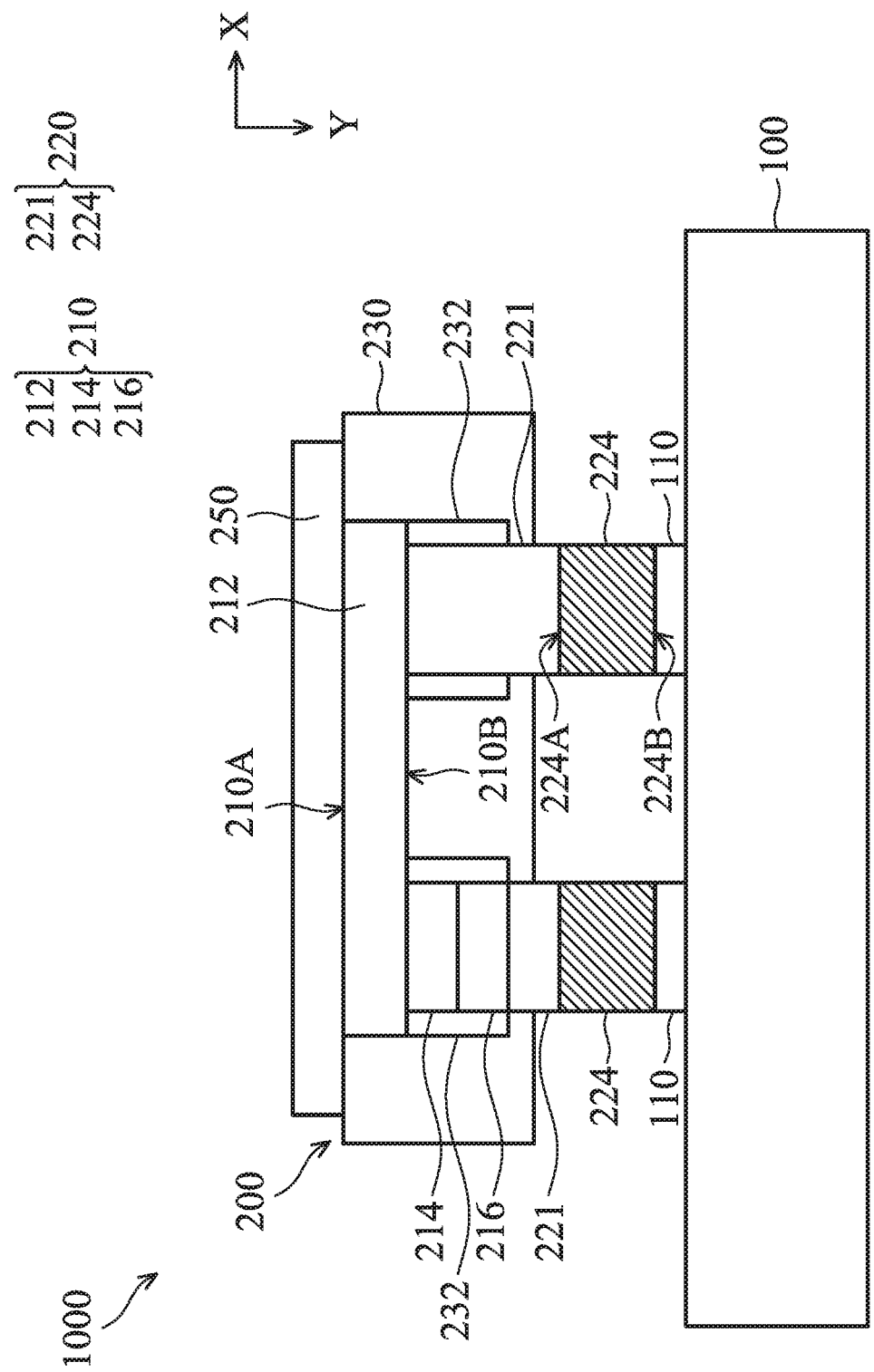
FIG. 8 is a cross-sectional view of a display device in accordance with some embodiments of the present disclosure.

Referring to FIG. 8, FIG. 8 is a cross-sectional view of the display device 1000 in accordance with some embodiments of the present disclosure. In some embodiments, as shown in FIG. 8, the display device 1000 further includes a transparent structure 250 over the first surface 210A. The transparent structure 250 is a transparent layer whose refractive index is smaller than 2.4. In this embodiment, the performance of the light-extraction of the light-emitting part 210 is improved after the formation of the transparent structure 250 with small refractive index on the first surface 210A of the light-emitting part 210.

Figure 9:
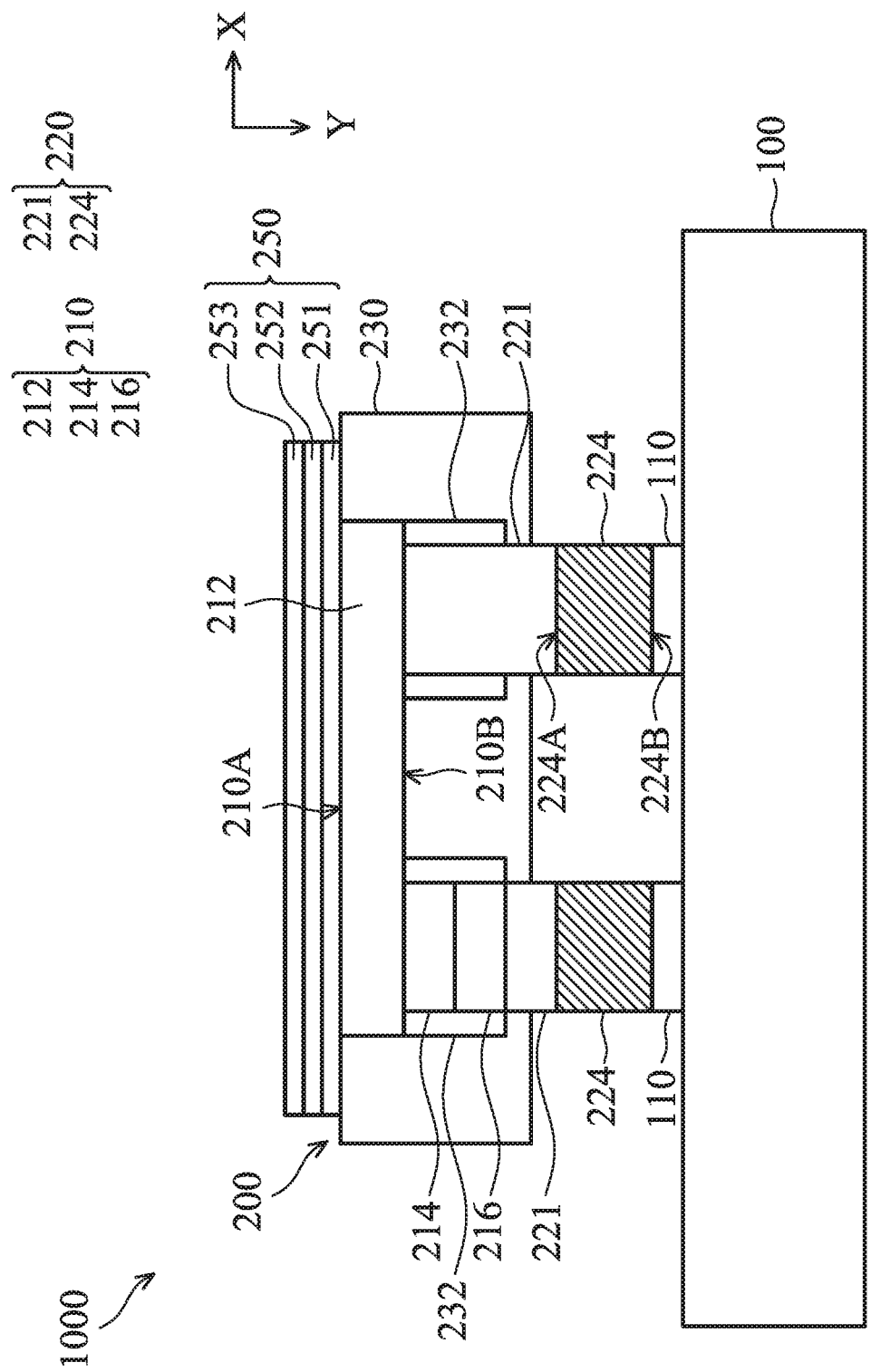
FIG. 9 is a cross-sectional view of a display device in accordance with some embodiments of the present disclosure.

Referring to FIG. 9, FIG. 9 is a cross-sectional view of the display device 1000 in accordance with some embodiments of the present disclosure. In some embodiments, as shown in FIG. 9, the transparent structure 250 includes a first transparent layer 251, a second transparent layer 252 and a third transparent layer 253. The first transparent layer 251 is disposed on the first surface 210A of the light-emitting part 210, the second transparent layer 252 is disposed on the first transparent layer 251 and the third transparent layer 253 is disposed on the second transparent layer 252. In some embodiments, the refractive index of the third transparent layer 253 is smaller than that of the second transparent layer 252, the refractive index of the second transparent layer 252 is smaller than that of the first transparent layer 251, and the refractive index of the first transparent layer 251 is smaller than that of the semiconductor layer 212.

Although FIG. 9 illustrates the transparent structure 250 includes three layers, embodiments of the disclosure are not limited thereto. In some embodiments, the transparent structure 250 includes two or more transparent layers, and the refractive index of the transparent layers become smaller as it moves away from the first surface 210A of the light-emitting part 210. In this embodiment, the performance of the light-extraction of the light-emitting part 210 is improved after the formation of the transparent structure 250 with gradient refractive index on the first surface 210A of the light-emitting part 210.

Figure 10:
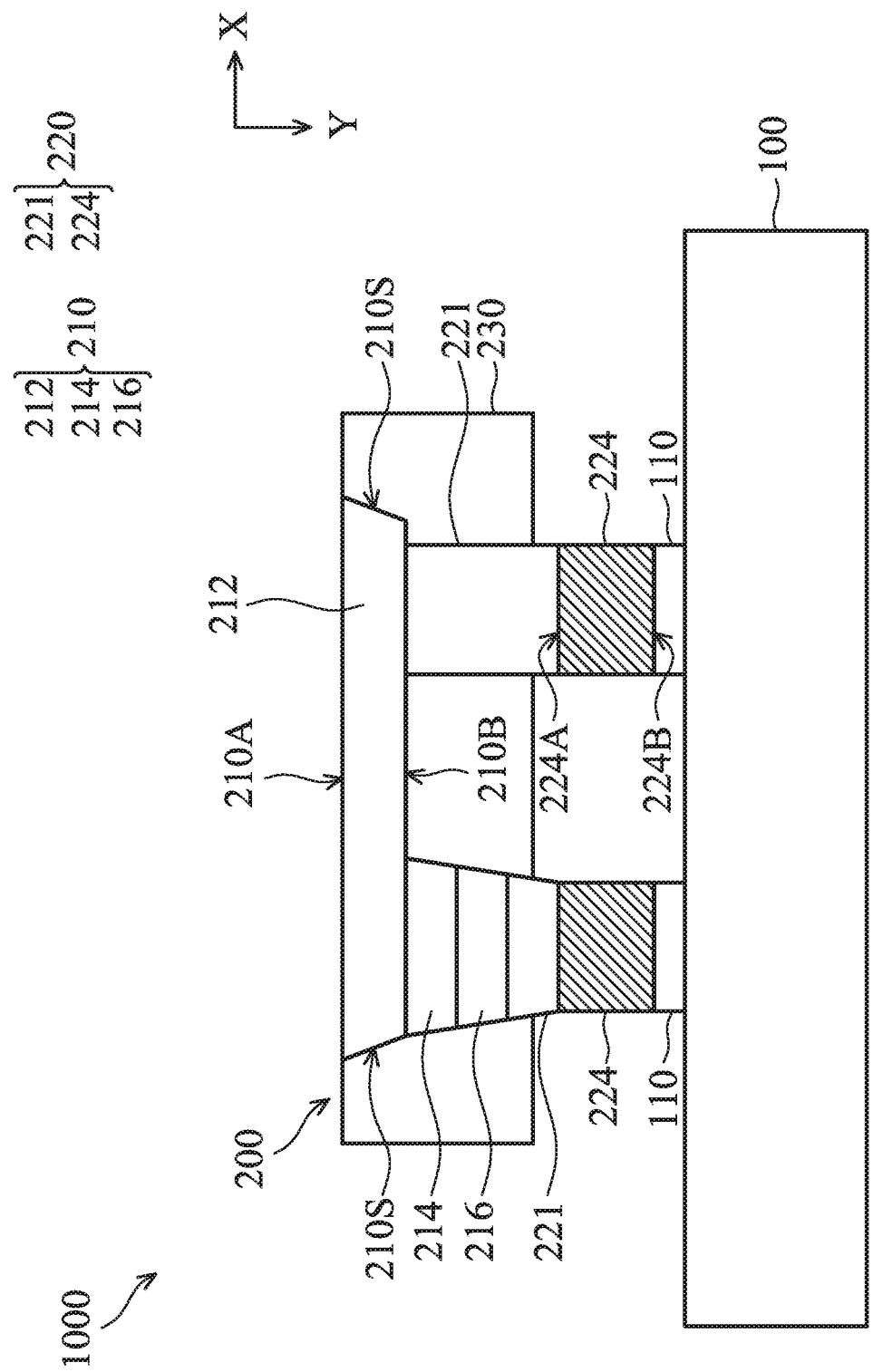
FIG. 10 is a cross-sectional view of a display device in accordance with some embodiments of the present disclosure.

Referring to FIG. 10, FIG. 10 is a cross-sectional view of the display device 1000 in accordance with some embodiments of the present disclosure. In some embodiments, as shown in FIG. 10, the sidewall 210S of the light-emitting part 210 is tapered along Y direction. The tapered sidewall 210S may be formed by performing an etching process on the semiconductor layer 212, the light-emitting layer 214 and the semiconductor layer 216. In this embodiment, the performance of the light-extraction of the light-emitting part 210 is improved after the formation of the light-emitting part 210 with tapered sidewall 210S.

Figure 11:
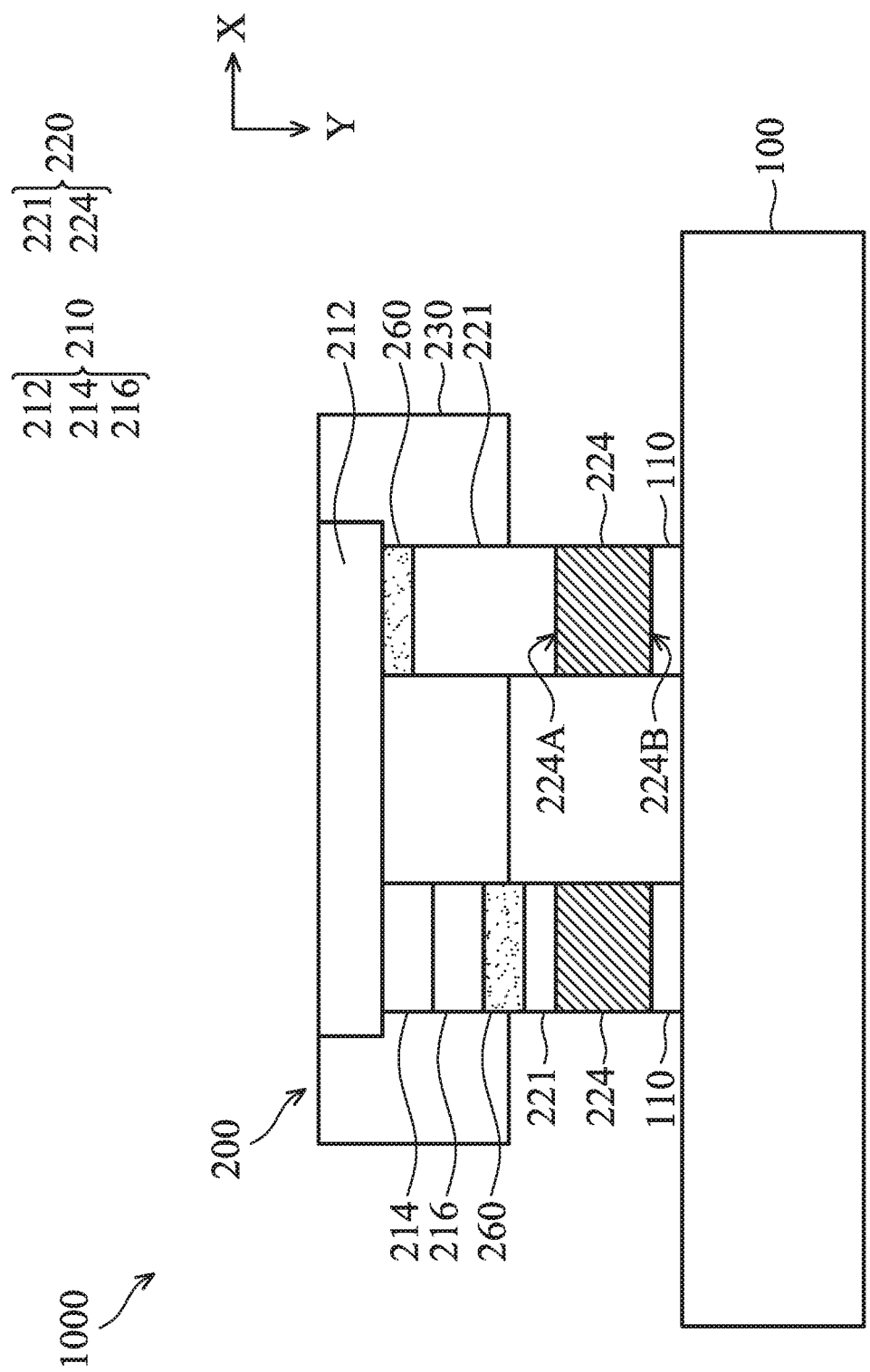
FIG. 11 is a cross-sectional view of a display device in accordance with some embodiments of the present disclosure.

Referring to FIG. 11, FIG. 11 is a cross-sectional view of the display device 1000 in accordance with some embodiments of the present disclosure. In some embodiments, as shown in FIG. 11, the display device 1000 further includes a first reflective layer 260 which is disposed between the light-emitting part 210 and the protective part 230. More specifically, the first reflective layer 260 is disposed in the protective part 230, and between the semiconductor layer 212, the semiconductor layer 216 and the conductive pad 221. In some embodiments, the reflectivity of the first reflective layer 260 is greater than 80%. In some embodiments, the material of the first reflective layer 260 include, but is not limited to, aluminum, silver or other metals with reflectivity greater than 80%. In this embodiment, the performance of the light-extraction of the light-emitting part 210 is improved after the formation of the first reflective layer 260 whose reflectivity greater than 80%.

Figure 12:
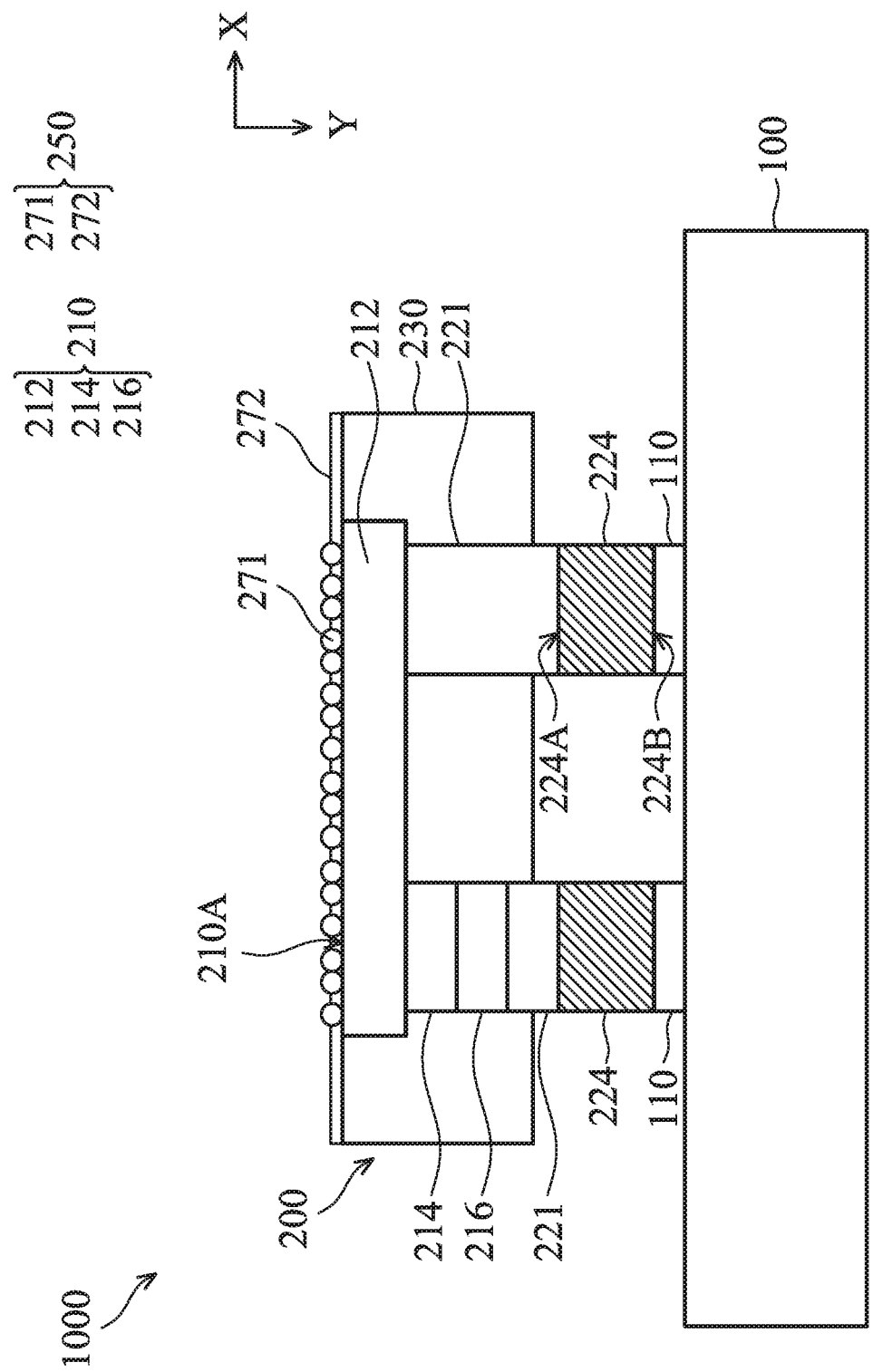
FIG. 12 is a cross-sectional view of a display device in accordance with some embodiments of the present disclosure.

Referring to FIG. 12, FIG. 12 is a cross-sectional view of the display device 1000 in accordance with some embodiments of the present disclosure. In some embodiments, as shown in FIG. 12, the transparent structure 250 includes multiple nanoparticles 271 and an adhesive layer 272. In some embodiments, the nanoparticles 271 are sprayed on the first surface 210A of the light-emitting part 210, and the adhesive layer 272 is coated on the first surface 210A to fix the nanoparticles 271. The material of the nanoparticles 271 includes, but is not limited to, zirconium dioxide ($ZrO_2$), titanium dioxide ($TiO_2$), silicon dioxide (SiO2), tantalum pentoxide ($Ta_2O_5$), tungsten oxide ($WO_3$), yttrium oxide ($Y_2O_3$), cerium dioxide ($CeO_2$), antimony trioxide ($Sb_2O_3$), niobium dioxide ($Nb_2O_2$), boron trioxide ($B_2O_3$), alumina trioxide ($Al_2O_3$), zinc oxide (ZnO), indium trioxide ($In_2O_3$), cerium trifluoride ($CeF_3$), magnesium difluoride ($MgF_2$), calcium difluoride ($CaF_2$), a combination thereof or other suitable metal nanoparticles.

The material of the adhesive layer 272 includes, but is not limited to, optical adhesive (OCA), optical clear resin (OCR) or other suitable transparent materials. In this embodiment, the performance of the light-extraction of the light-emitting part 210 is improved after spraying the nanoparticles 271 on the first surface 210A of the light-emitting part 210.

Figure 13:
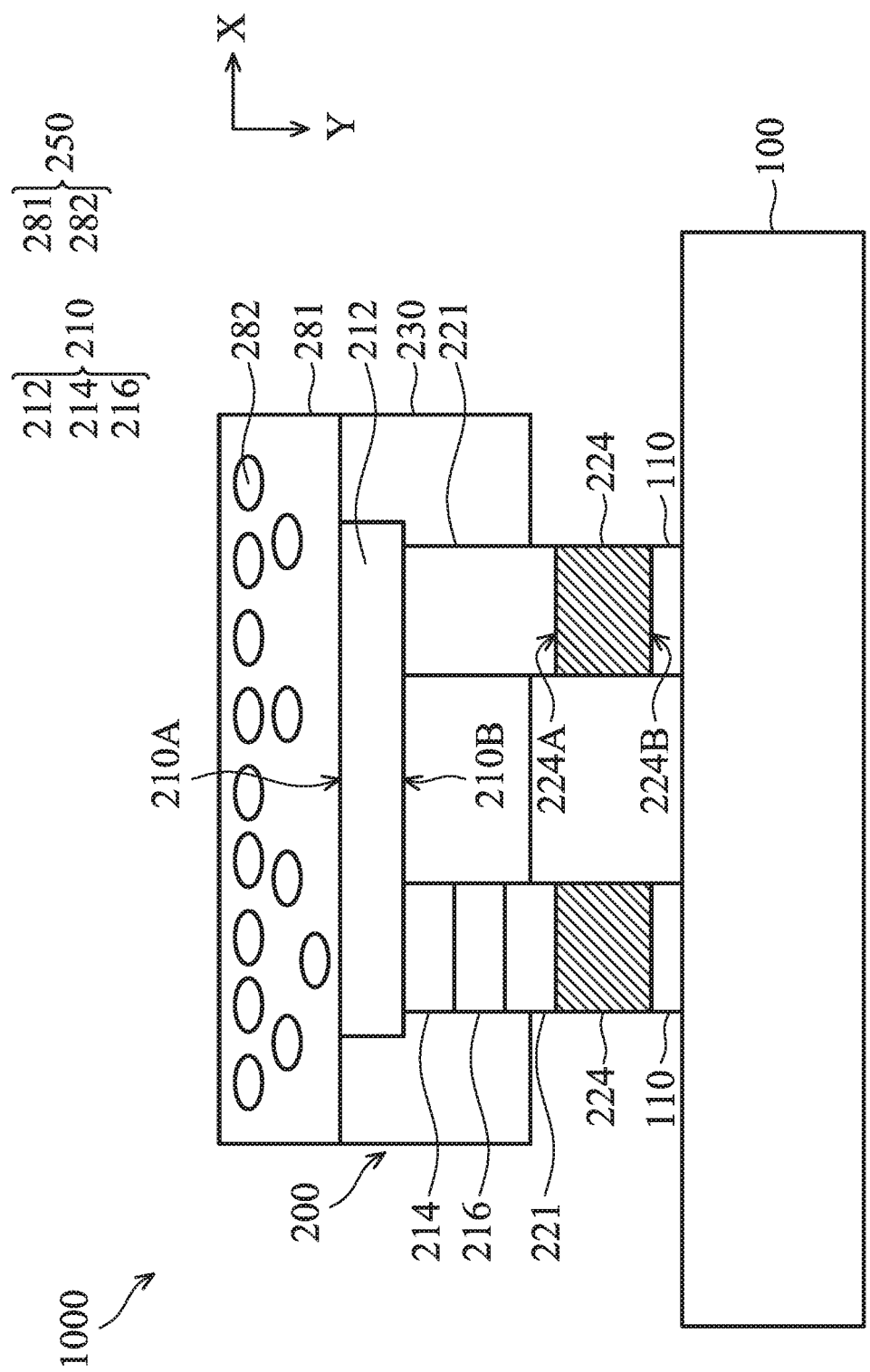
FIG. 13 is a cross-sectional view of a display device in accordance with some embodiments of the present disclosure.

Referring to FIG. 13, FIG. 13 is a cross-sectional view of the display device 1000 in accordance with some embodiments of the present disclosure. In some embodiments, as shown in FIG. 13, the transparent structure 250 includes an organic layer 281 and multiple vias 282. The organic layer 281 is disposed above the first surface 210A of the light-emitting part 210, and the vias 282 are dispersed in the organic layer 281. As shown in FIG. 13, the density of the vias 282 increases along the direction from the second surface 210B to the first surface 210A. More specifically, the density of the vias 282 has a minimum at the first surface 210A of the light-emitting part 210, and the density of the vias 282 increases as it moves away from the first surface 210A. In some embodiments, the vias 282 is air or other noble gases.

In some embodiments, the material of the organic layer 281 includes, but is not limited to, poly(methyl methacrylate) (PMMA), polycarbonate (PC), polyimide (PI) and other applicable materials. In some embodiments, the organic layer 281 is dipped in an organic solvent such as alcohol, and the vias are expanded. As a result, the vias 282 are formed. In this embodiment, the density of the vias 282 increases as it moves away from the first surface 210A. Therefore, the refractive index of the transparent structure 250 decreases as it moves away from the first surface 210A. In this embodiment, the performance of the light-extraction of the light-emitting part 210 is improved after the formation of the transparent structure 250 with gradient refractive index on the first surface 210A of the light-emitting part 210.

Figure 14:
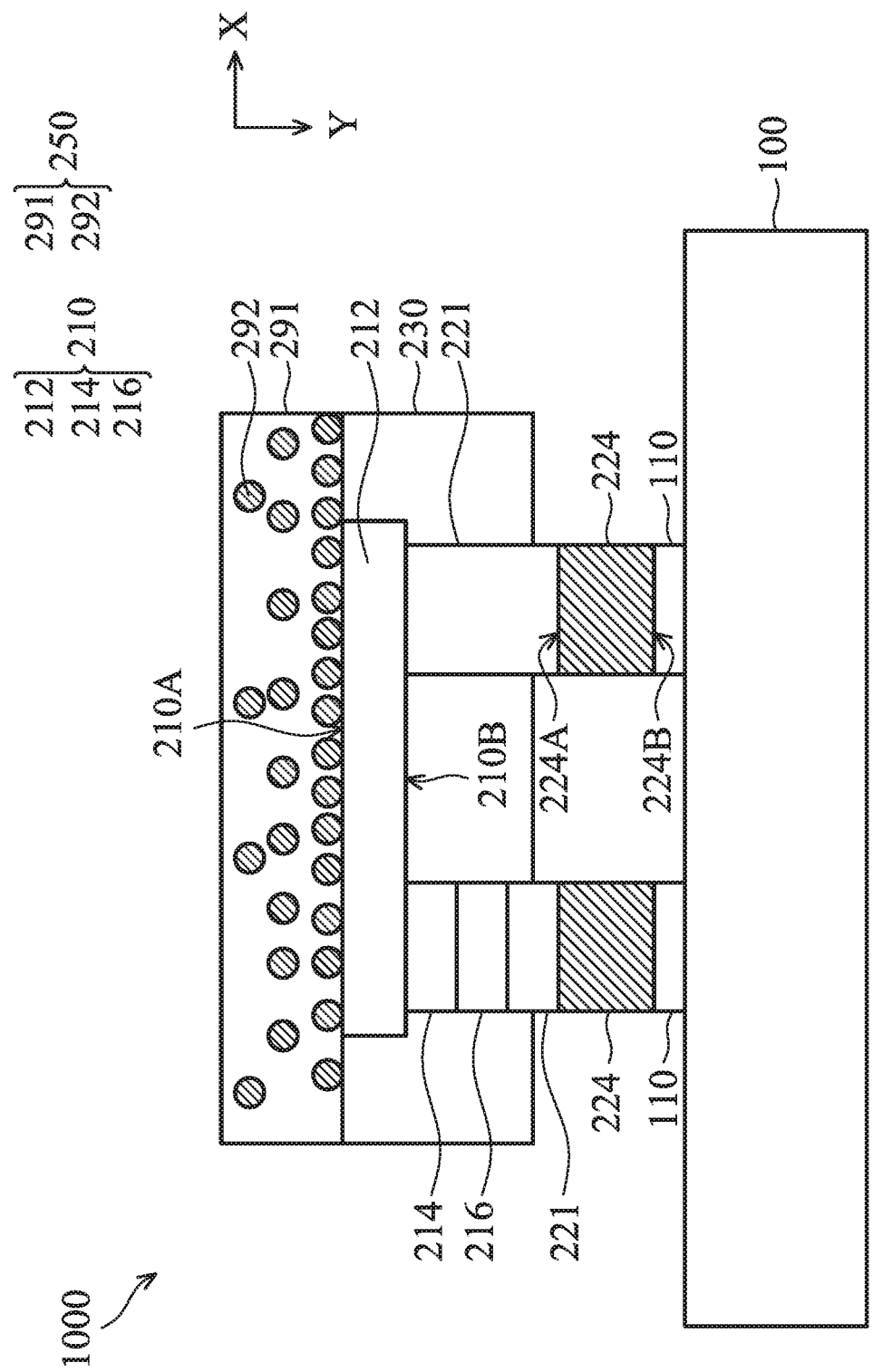
FIG. 14 is a cross-sectional view of a display device in accordance with some embodiments of the present disclosure.

Referring to FIG. 14, FIG. 14 is a cross-sectional view of the display device 1000 in accordance with some embodiments of the present disclosure. In some embodiments, as shown in FIG. 14, the transparent structure 250 includes an organic layer 291 and multiple nanoparticles 292. The organic layer 291 is disposed above the first surface 210A of the light-emitting part 210, and the nanoparticles 292 are dispersed in the organic layer 291. As shown in FIG. 14, the density of the nanoparticles 292 decreases along the direction from the second surface 210B to the first surface 210A. More specifically, the density of the nanoparticles 292 has a maximum at the first surface 210A of the light-emitting part 210, and the density of the nanoparticles 292 decreases as it moves away from the first surface 210A.

The materials of the organic layer 291 and the nanoparticles 292 may be the same as or similar to those of the organic layer 281 and the nanoparticles 271, respectively. In some embodiments, the organic layer 291 is dipped in an organic solvent including the nanoparticles 292, and the vias in the organic layer 281 are replaced by the nanoparticles 292. In this embodiment, the density of the nanoparticles 292 decreases as it moves away from the first surface 210A. Therefore, the refractive index of the transparent structure 250 decreases as it moves away from the first surface 210A. In this embodiment, the performance of the light-extraction of the light-emitting part 210 is improved after the formation of the transparent structure 250 with gradient refractive index on the first surface 210A of the light-emitting part 210.

Figure 15:
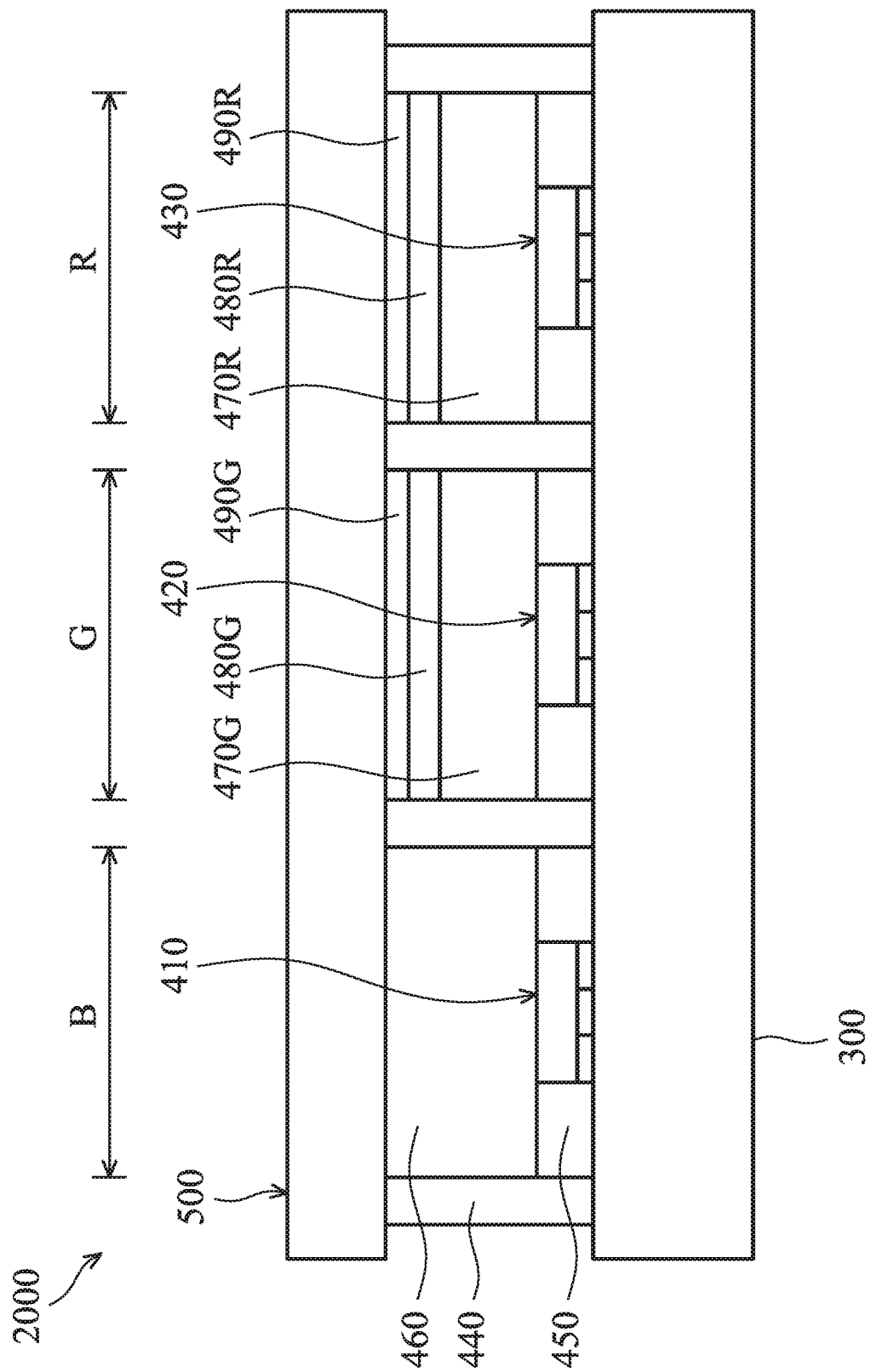
FIG. 15 is a cross-sectional view of a display device in accordance with some embodiments of the present disclosure.

Referring to FIG. 15, FIG. 15 is a cross-sectional view of a light-emitting unit 2000 in accordance with some embodiments of the present disclosure. In some embodiments, as shown in FIG. 15, the light-emitting unit 2000 has a blue pixel region B, a red pixel region R and a green pixel region G corresponding to different wavelengths of light emitted. As shown in FIG. 15, the light-emitting unit 2000 includes a first light-emitting unit 410, a second light-emitting unit 420 and a third light-emitting unit 430 disposed over a substrate 300. The substrate 300 may be the same as or similar to the substrate 100, and the descriptions of the substrate 300 is omitted for brevity. The first light-emitting unit 410 is disposed in the blue pixel region B, and surrounded by a first filler 450. The material of the first filler 450 may include, but is not limited to, silicone, epoxy, poly(methyl methacrylate) (PMMA), polycarbonate (PC) and other applicable materials. The light-emitting unit 2000 also includes a second filler 460 over the first filler 450. The refractive index of the second filler 460 may be the same as or different from that of the first filler 450. In some embodiments, the refractive index of the second filler 460 is smaller than that of the first filler 450. It appreciates that some elements or features of the first light-emitting unit 410, the second light-emitting unit 420 and the third light-emitting unit 430 are omitted for brevity, embodiments of the disclosure are not limited thereto. In some embodiments, the first light-emitting unit 410, the second light-emitting unit 420 and the third light-emitting unit 430 are the same as the light-emitting unit 200 of the present disclosure.

As shown in FIG. 15, the second light-emitting unit 420 and the third light-emitting unit 430 are disposed in the green pixel region G and the red pixel region R, respectively, and surrounded by the first filler 450. In addition, the light-emitting unit 2000 also includes a quantum dot film 470G and a quantum dot film 470R over the second light-emitting unit 420 and the third light-emitting unit 430, respectively. The material of the quantum dot film 470G and the quantum dot film 470R may include, but is not limited to, an organic layer blended with a quantum dot or an inorganic layer blended with a quantum dot. The quantum dot may be a nano three-dimensional structure including zinc, cadmium, selenium, sulfur, or a combination thereof. The grain diameter of the quantum dot may range from about 1 nm-10 nm. By fine-tuning the grain diameter of the quantum dot, the spectrum of light resulting from the excitation of the light by the second light-emitting unit 420 and the third light-emitting unit 430 may be altered. For example, the quantum dot film 470G blended with a quantum dot having the first grain diameter may emit light of a green color after excitation by blue light, and the quantum dot film 470R blended with a quantum dot having the second grain diameter different from the first grain diameter may emit light of a red color after excitation by blue light.

As shown in FIG. 15, the light-emitting unit 2000 also includes a color conversion enhancement layer 480G and a color conversion enhancement layer 480R over the quantum dot film 470G and the quantum dot film 470R, respectively. The color conversion enhancement layer 480G and the color conversion enhancement layer 480R may include, but is not limited to, a material reflecting blue light. Unexcited blue light may be reflected back to the quantum dot film 470R and the quantum dot film 470G by the color conversion enhancement layer 480R and the color conversion enhancement layer 480G, and thereby the efficiency of transformation from blue light to light of another color through the quantum dot film 470R and the quantum dot film 470G is improved. As shown in FIG. 15, the light-emitting unit 2000 also includes a color filter film 490G and a color filter film 490R over the color conversion enhancement layer 480G and the color conversion enhancement layer 480R. The color filter film 490G and the color filter film 490G may include a blue color filter, a red color filter, a green color filter or a combination thereof.

Moreover, as shown in FIG. 15, the light-emitting unit 2000 further includes a protective layer 500. The protective layer 500 is disposed above the second filler 460, color filter film 490G and color filter film 490R. The protective layer 500 may include a transparent substrate such as a glass substrate, a ceramic substrate, a plastic substrate or another applicable substrate. The material of the protective layer 500 may include, but is not limited to, phosphosilicate glass (PSG), borophosphosilicate glass (BPSG), silicon oxide, silicon nitride or high-k dielectric materials. The high-k dielectric materials may include, but is not limited to, metal oxide, metal nitride, metal silicide, transition metal oxide, transition metal nitride, transition metal silicide, transition metal oxynitride, metal aluminate, zirconium silicate, and zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, any other applicable high-k dielectric material, and combinations thereof.

As shown in FIG. 15, the light-emitting unit 2000 includes a light-shielding layer 440 disposed between the substrate 300 and the protective layer 500. The blue pixel region B, the green pixel region G and the red pixel region R are separated from the light-shielding layer 440. The light-shielding layer 440 is used to shield the elements or region which is not used to display colors. For example, the light-shielding layer 440 may be used to shield the data lines and scan lines. The light-shielding layer 440 may include, but is not limited to, black photoresist, black printing ink, black resin or any other suitable light-shielding materials or light-shielding colors. Generally, the light-shielding materials and the light-shielding colors may prevent light from being transmitted, and are not limited to the absorption of light. The light-shielding materials and the light-shielding colors may also be highly reflective. The light-shielding colors may include, but are not limited to, high-concentration white material. The light-shielding colors are not limited to consisting of one material. The light-shielding colors may also include a transparent material covered by highly reflective metal material.

In some embodiments, the first light-emitting unit 410, the second light-emitting unit 420 and the third light-emitting unit 430 emit blue light (with a wavelength between about 380 nm and about 500 nm), but the dominant wavelengths emitted by the first light-emitting unit 410, the second light-emitting unit 420 and the third light-emitting unit 430 are different. The dominant wavelength means the wavelength with the greatest intensity emitted by the light-emitting unit. In some embodiments, the dominant wavelength of the light emitted by the second light-emitting unit 420 is shorter than that of the first light-emitting unit 410 by 2 nm or more, and the dominant wavelength of the light emitted by the third light-emitting unit 430 is longer than that of the first light-emitting unit 410 by 2 nm or more. In this embodiment, the difference of the dominant wavelength of the emitted light between the third light-emitting unit 430 and the second light-emitting unit 420 is greater than about 4 nm and less than 44 nm. In some embodiments, the difference of the dominant wavelength of the emitted light between the third light-emitting unit 430 and the second light-emitting unit 420 is greater than about 10 nm and less than 50 nm. In this embodiment, the mura effect that is caused by different dominant wavelengths of the light-emitting unit can be prevented by disposing the second light-emitting unit 420 with the shorter dominant wavelength in the green pixel region G and the third light-emitting unit 430 with the longer dominant wavelength in the red pixel region R. Therefore, the spec of the light-emitting unit is increased, and the cost of forming the light-emitting unit 2000 may be decreased.

In some embodiments, the first light-emitting unit 410, the second light-emitting unit 420 and the third light-emitting unit 430 emit blue light, but the dominant wavelengths of the three are different. In some embodiments, the dominant wavelength of the light emitted by the second light-emitting unit 420 is shorter than that of the first light-emitting unit 410 by 5 nm or more, and the dominant wavelength of the light emitted by the third light-emitting unit 430 is shorter than that of the first light-emitting unit 410 by 5 nm or more. In this embodiment, since the quantum dot film 470G and the quantum dot film 470R have high absorptivity for light with shorter wavelength, the performance of the light-emitting is improved. Therefore, the spec of the light-emitting unit is increased, and the cost of forming the light-emitting unit 2000 may be decreased.

In some embodiments, the first light-emitting unit 410 emits blue light, the second light-emitting unit 420 emits green light (with a wavelength between about 500 nm and about 580 nm), and the third light-emitting unit 430 emits blue light or ultraviolet. Since it is difficult to form a light-emitting unit emitting red light on the substrate using a flip chip technique, the process problem can be solved by combining the third light-emitting unit 430 emitting blue light or ultraviolet and the quantum dot film 470R to emit red light.

In some embodiments, the first light-emitting unit 410 emits blue light, the second light-emitting unit 420 emits blue light or ultraviolet, and the third light-emitting unit 430 emits red light (with a wavelength between about 600 nm and about 780 nm). Since the light-emitting unit emitting green light has broader full width at half maximum (FWHM), the intensity of the green light becomes smaller. Therefore, the problem described above can be solved by combining the second light-emitting unit 420 emitting blue light or ultraviolet and the quantum dot film 470G to emit green light.

Figure 16A:
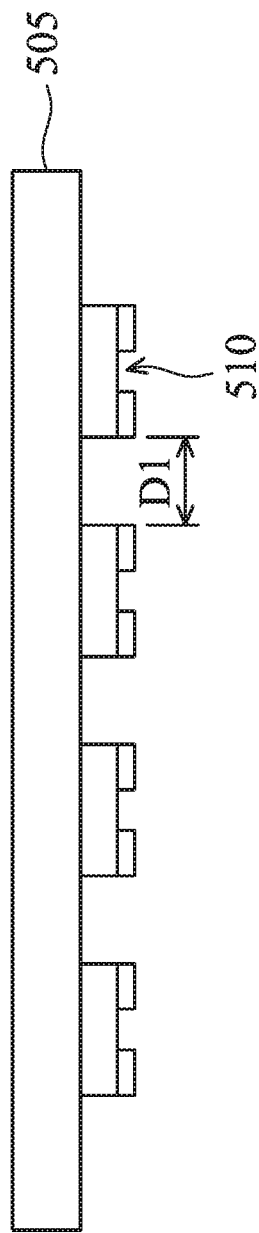

Referring to FIGS. 16A-16F, FIGS. 16A-16F are cross-sectional views of various stages of a process for attaching light-emitting units 510 to a substrate 600 in accordance with some embodiments of the present disclosure. As shown in FIG. 16A, a wafer 505 is provided. Multiple light-emitting units 510 are formed over the wafer 505, and a pitch between two adjacent light-emitting units 510 is defined as D1. The light-emitting units 510 may be such as a sapphire substrate including alumina oxide and gallium nitride formed thereon. It appreciates that although some elements or features of the light-emitting units 510 are omitted for brevity, embodiments of the disclosure are not limited thereto. In some embodiments, the structure of the light-emitting nits 510 may be the same as or similar to that of the light-emitting unit 200 described in the embodiments of the present disclosure.

Figure 16B:
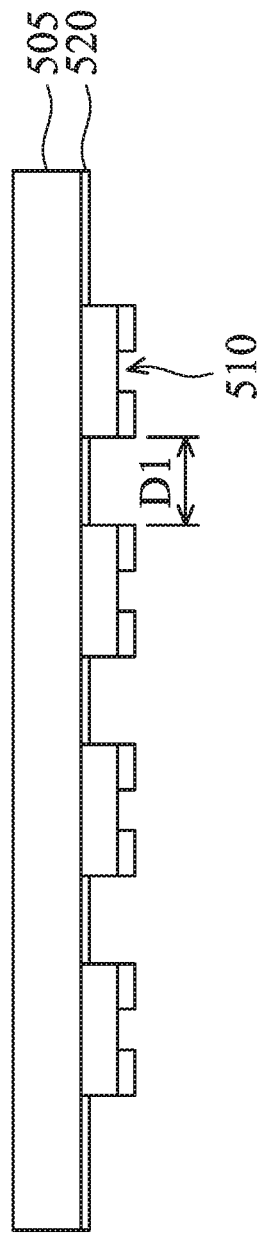

Next, in some embodiments, as shown in FIG. 16B, a reflective layer 520 is coated on the wafer 505. The reflective layer 520 is configured to block or absorb ultraviolet in the subsequent laser lift off (LLO) process. In some embodiments, the material of the reflective layer 520 includes, but is not limited to, barium sulfate, magnesium fluoride, magnesium oxide, aluminum oxide, titanium oxide, lanthanum oxide, germanium oxide, tellurium oxide, erbium oxide, zirconium oxide, a combination thereof or other material capable of reflecting ultraviolet. In some embodiments, the material of the reflective layer 520 includes metal material such as gold, silver, titanium, nickel or aluminum. The reflective layer 520 may be formed by spin-on coating process or other suitable process.

Figure 16C:
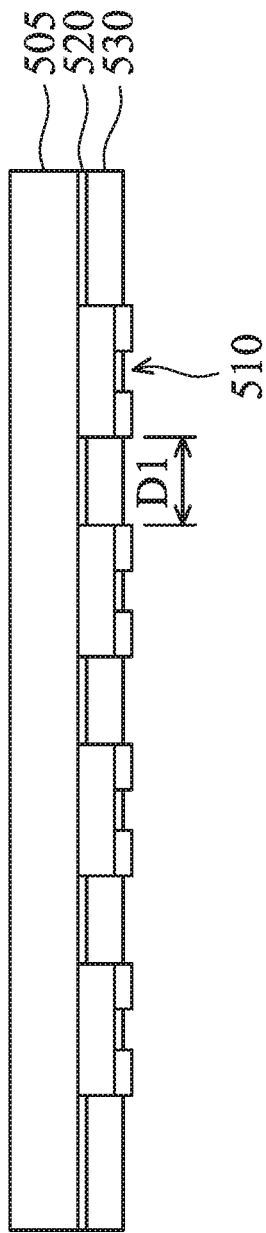

Next, in some embodiments, as shown in FIG. 16C, an elastic layer 530 is formed over the reflective layer 520. In some embodiments, the elastic layer 530 surrounds the light-emitting units 510, and covers the light-emitting layer and the surface of the semiconductor layer of the light-emitting units 510. The material of the elastic layer 530 includes poly(methyl methacrylate) (PMMA), polycarbonate (PC), polyimide (PI) and other elastic materials. Although FIG. 16C illustrates the light-emitting units 510 are not covered completely by the elastic layer 530 (e.g. the conductive pads of the light-emitting units 510 are not covered by the elastic layer 530), embodiments of the disclosure are not limited thereto. In some embodiments, the light-emitting units 510 are covered completely by the elastic layer 530.

Next, in some embodiments, as shown in FIG. 161D, the wafer 505 and the reflective layer 520 are removed from the light-emitting units 510. In some embodiments, the wafer 505 is removed by performing the LLO process. In some embodiments, an etching process is performed to remove the reflective layer 520 after the wafer 505 is removed.

Next, in some embodiments, as shown in FIG. 16E, the elastic layer 530 is extended by performing an extension process. The extending process includes single-axially extension process, bi-axially extension process or other suitable processes.

Next, in some embodiments, as shown in FIG. 16F, the light-emitting units 510 are attached to a substrate 600 after the elastic layer 530 is extended. After the extension process is performed as shown in FIG. 16E, a pitch between two adjacent light-emitting units 510 becomes D2 greater than D1. The substrate 600 may be the same as or similar to the substrate 100 mentioned above. In this embodiment, the pitch between two adjacent light-emitting units 510 becomes longer. Therefore, when the light-emitting units 510 are formed on the wafer 505, the light-emitting units 510 may be arranged in a narrower pitch. As a result, it is not necessary to form the light-emitting units 510 with needed pitch. Therefore, more light-emitting units 510 can be formed on the wafer 505, and the cost is decreased.

Referring to FIGS. 17A-17E, FIGS. 17A-17E are cross-sectional views of various stages of a process for attaching the light-emitting units 510 to a substrate 600 in accordance with some embodiments of the present disclosure. The materials and processing steps to arrive at the intermediate structure illustrated in FIG. 17A may be similar to the previously described embodiment in FIG. 16A through 16D, and thus, the description is not repeated herein. Details regarding this embodiment that are similar to those for the previously described embodiment will not be repeated herein.

Figure 17A:
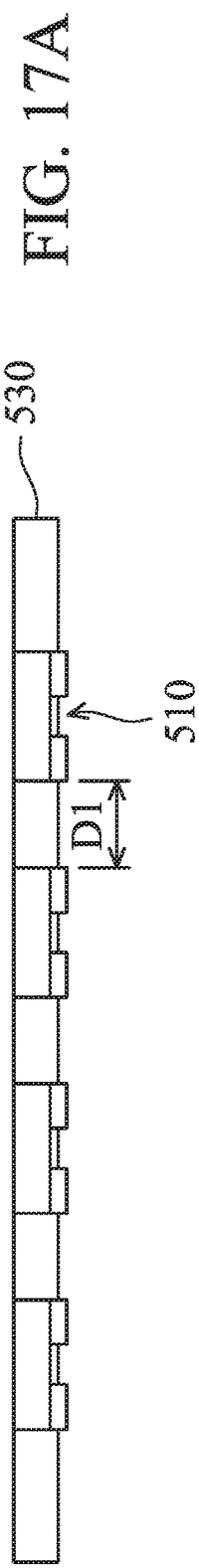
Figure 17B:
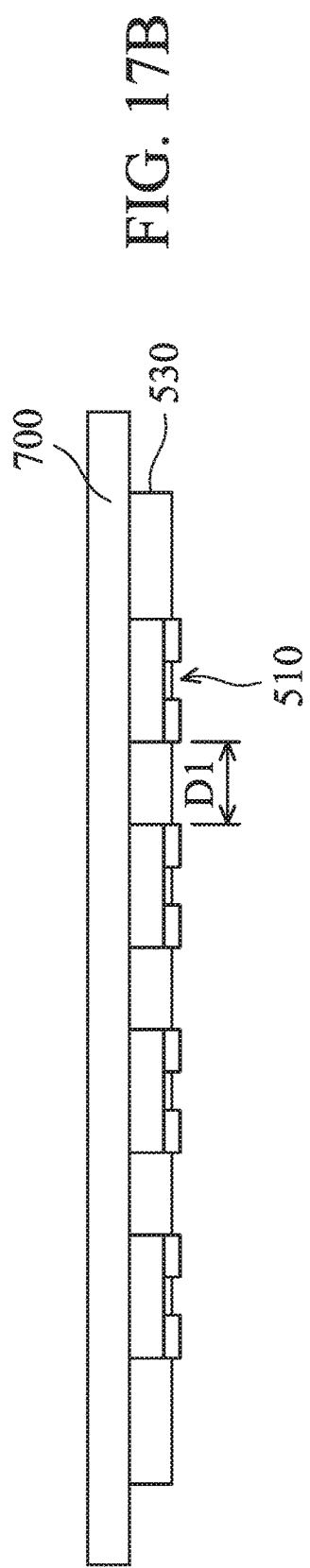

In some embodiments, as shown in FIG. 17B, the light-emitting units 510 and the elastic layer 530 are attached to a metal substrate 700. The metal substrate 700 may be copper, aluminum, molybdenum, tungsten, gold, chromium, nickel, platinum, titanium, iridium, rhodium, the alloy mentioned above or other thermal conductive and electrically conductive metal materials. In some embodiments, the metal substrate 700 is a shape memory alloy such as tin-nickel-copper-zinc alloy, copper-aluminum-nickel alloy.

Figure 17C:
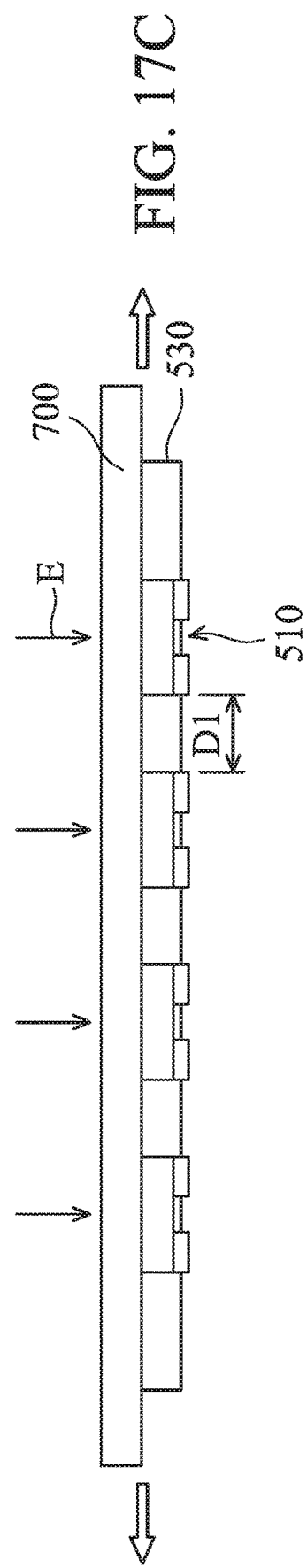

Next, in some embodiments, as shown in FIG. 17C, a heating process E is performed on the metal substrate 700. The metal substrate 700 is expanded after the heating process E is performed. As a result, the elastic layer 530 is expanded due to the expansion of the metal substrate 700. In some embodiments, the heating process E is replaced by an electric charge.

Next, in some embodiments, as shown in FIG. 17D, the light-emitting units 510 are attached to a substrate 600 after the elastic layer 530 is extended. After the heating process E is performed as shown in FIG. 17D, a pitch between two adjacent light-emitting units 510 becomes D2 greater than D1.

Next, in some embodiments, as shown in FIG. 17E, the metal substrate 700 is removed. In this embodiment, the pitch between two adjacent light-emitting units 510 becomes longer. Therefore, when the light-emitting units 510 are formed on the wafer 505, the light-emitting units 510 may be arranged in a narrower pitch. As a result, it is not necessary to form the light-emitting units 510 with needed pitch. Therefore, more light-emitting units 510 can be formed on the wafer 505, and the cost is decreased.

In addition, FIGS. 17D and 17E illustrate the light-emitting units 510 is attached to the substrate 600 before the removing of the metal substrate 700, embodiments of the disclosure are not limited thereto. In some embodiments, the metal substrate 700 is removed before the attaching of the light-emitting units 510 to the substrate 600.

In addition, FIGS. 17B-17D illustrate the semiconductor layer of the light-emitting units 510 is attached to the metal substrate 700, embodiments of the disclosure are not limited thereto. In some embodiments, the surface of the conductive pad is adjoined to the metal substrate 700.

In addition, the wafer 505 is not a plane structure. The exterior of the wafer 505 may be seen as a ~ shape, a υ shape, ω shape, Ω shape, ν shape, σ shape or o shape in a cross section. There is a highest point in the partial area such as a ridge point or a top point, and a lowest point in the partial area such as a saddle point or a concave point.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a display device comprising:
   forming a light-emitting unit on a wafer; and
   adjoining the light-emitting unit to a bonding pad of a substrate through a bonding layer;
   wherein the adjoining of the bonding layer to the bonding pad of the substrate comprises:
   coating an elastic layer on the wafer;
   removing the light-emitting unit from the wafer;
   attaching the light-emitting unit and the elastic layer to a metal substrate after removing the light-emitting unit from the wafer;
   heating the metal substrate so that the metal substrate expands, and the elastic layer extends; and
   removing the metal substrate.

2. The method as claimed in claim 1, wherein the adjoining of the bonding layer to the bonding pad of the substrate further comprises:
   forming a reflective layer on the wafer before coating the elastic layer on the wafer.

* * * * *